(12) United States Patent
Tsuji

(10) Patent No.: US 11,227,850 B2
(45) Date of Patent: Jan. 18, 2022

(54) SEMICONDUCTOR DEVICE AND METHOD FOR MANUFACTURING THE SAME

(71) Applicant: Mitsubishi Electric Corporation, Tokyo (JP)

(72) Inventor: Seiichi Tsuji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 6 days.

(21) Appl. No.: 16/935,521

(22) Filed: Jul. 22, 2020

(65) Prior Publication Data
US 2021/0296272 A1    Sep. 23, 2021

(30) Foreign Application Priority Data

Mar. 17, 2020   (JP) .............................. JP2020-045930

(51) Int. Cl.
    *H01L 23/00*      (2006.01)

(52) U.S. Cl.
    CPC .............. *H01L 24/13* (2013.01); *H01L 24/11* (2013.01); *H01L 24/81* (2013.01); *H01L 2224/1357* (2013.01); *H01L 2924/0105* (2013.01); *H01L 2924/01079* (2013.01)

(58) Field of Classification Search
    CPC ......... H01L 24/13; H01L 24/81; H01L 24/11; H01L 2924/01079; H01L 2924/0105; H01L 2224/1357
See application file for complete search history.

(56) References Cited

U.S. PATENT DOCUMENTS

| | | | |
|---|---|---|---|
| 6,989,122 B1* | 1/2006 | Pham ..................... | B29C 45/37 264/272.15 |
| 7,811,863 B1* | 10/2010 | Lin ..................... | H01L 21/6835 438/122 |
| 11,127,654 B2* | 9/2021 | Lim ..................... | H01L 25/0657 |
| 2007/0139899 A1* | 6/2007 | Van Schuylenbergh ..................... | H01L 23/552 361/760 |
| 2011/0068659 A1 | 3/2011 | Ichikawa | |

FOREIGN PATENT DOCUMENTS

| | | |
|---|---|---|
| JP | S52-104058 A | 9/1977 |
| JP | H02-024552 U | 2/1990 |
| JP | 2011-091787 A | 5/2011 |

* cited by examiner

*Primary Examiner* — Douglas W Owens
(74) *Attorney, Agent, or Firm* — Studebaker & Brackett PC

(57) ABSTRACT

A method includes: providing a package body including a mounting part having a chip mounting region for mounting a semiconductor chip, a side wall part having a first sealing surface continuously provided over an entire perimeter of the mounting part, surrounding the chip mounting region and provided on the mounting part, a first recess provided on the first sealing surface, and a first solder outflow prevention part continuously provided on the first sealing surface and positioned closer to the chip mounting region side than the first recess; providing a cap having a second sealing surface facing the first sealing surface; providing a ball solder made of an alloy of gold and tin as principal ingredients; placing the ball solder in the first recess; placing the cap on the ball solder; and melting once and then solidifying the ball solder to bond the first sealing surface and the second sealing surface.

24 Claims, 19 Drawing Sheets

SEMICONDUCTOR DEVICE AND METHOD FOR MANUFACTURING THE SAME

BACKGROUND OF THE INVENTION

Field

The present disclosure relates to a semiconductor device using a package having a hermetically sealed hollow structure and a method for manufacturing such a semiconductor device.

Background

FIG. 20 is a cross-sectional view of a conventional hermetically sealed semiconductor device. Reference numeral 91 denotes a concave package body. The package body 91 includes a mounting part 12 that forms a bottom surface. A surface near a center of a top surface of the mounting part 12 is a plane surface and is a chip mounting region 4 for mounting an electronic part 2 including a semiconductor chip. The electronic part 2 is bonded to the chip mounting region 4 by solder 94. The solder 94 is gold/tin solder. A side wall part 14 is provided on the top surface of the mounting part 12 so as to surround the chip mounting region 4. The package body 91 includes a terminal that electrically connects the inside and the outside, and the electronic part 2 and the terminal are connected via a metal wire or the like. Note that the terminal and the metal wire or the like are not shown.

The package body 91 and a cap 92 are soldered by solder 93 and a space 6 surrounded by the mounting part 12, the side wall part 14 and the cap 92 is hermetically sealed. A top end of the side wall part 14 is a first sealing surface 16a. The cap 92 is soldered to the first sealing surface 16a. A part of the cap 92 facing the first sealing surface 16a is a second sealing surface 16b. That is, the first sealing surface 16a and the second sealing surface 16b are bonded by the solder 93. The package body 91 and the cap 92 are gold-plated.

FIGS. 21A and 21B are explanatory diagrams illustrating a sealing method for a conventional semiconductor device. FIG. 21A is a perspective view illustrating the entire semiconductor device and FIG. 21B is a cross-sectional view of a part A shown by a dotted line in FIG. 21A.

In the conventional manufacturing of a semiconductor device, the electronic part 2 including a semiconductor chip is bonded to the chip mounting region 4 by solder 94 (not shown) first. Next, the electronic part 2 and a terminal (not shown) of the package body 91 are electrically connected via a metal wire (not shown) or the like.

Next, ribbon-shaped solder 93 shaped to the sealing surface 16a is placed on the sealing surface 16a of the package body 91, and further, the cap 92 is placed thereon. Next, the semiconductor device is moved to a heater and heated for a certain period of time. Next, with the ribbon-shaped solder 93 melted, the ribbon-shaped solder 93 is subjected to scrubbing to make the solder 93 wet. Next, the cooled solder is solidified again. The package body 91 is thereby bonded to the cap 92 and the space 6 is hermetically sealed.

Since the ribbon-shaped solder 93 is manufactured by shaping molten solder into a string shape in an air environment and rolling the shaped solder, an oxide film is easily formed on the surface.

For this reason, in sealing for the conventional semiconductor device, it is necessary to remove the oxide film of the solder 93 to obtain stable bonding. Therefore, it has been necessary to perform scrubbing to make solder wet.

"Scrubbing" is an operation of shaking the cap 92 with respect to the package body 91 while the solder 93 is in a molten state using tweezers or the like to thereby destroy the oxide film on the solder surface.

Patent Literature 1: JP H2-024552 A

SUMMARY

FIGS. 22A and 22B are perspective views illustrating a conventional semiconductor device after sealing. FIG. 22A is a perspective view illustrating an appearance of the conventional semiconductor device after sealing and FIG. 22B is a perspective view illustrating an interior of the conventional semiconductor device cut along a line Y in FIG. 22A.

In FIG. 22A, reference numeral 99a denotes the solder 93 that has flowed out to a side face outside the package body 91. In FIG. 22B, reference numeral 96 denotes a solder fragment of the solder 93 dropped in the package body 91 and reference numeral 99b denotes the solder 93 that has flowed out to a side face inside the package body 91.

In this way, according to the conventional sealing method for a semiconductor device, scrubbing may cause the oxidized part on the surface of the solder 93 to become a fragment and fall down in the semiconductor device. The fallen solder fragment may cause defects in a PIND test (Particle Impact Noise Detection test) for detecting a foreign substance in the package.

An object of the present disclosure, which has been made to solve the above problem, is to provide a structure of a semiconductor device and a hermetical sealing method with fewer defects in a PIND test.

A method for manufacturing a semiconductor device according to the present disclosure includes: providing a package body including a mounting part having a chip mounting region for mounting a semiconductor chip, a side wall part having a first sealing surface continuously provided over an entire perimeter of the mounting part, surrounding the chip mounting region and provided on the mounting part, a first recess provided on the first sealing surface, and a first solder outflow prevention part continuously provided on the first sealing surface and positioned closer to the chip mounting region side than the first recess; providing a cap having a second sealing surface facing the first sealing surface; providing a ball solder made of an alloy of gold and tin as principal ingredients; placing the ball solder in the first recess; placing the cap on the ball solder; and melting once and then solidifying the ball solder to bond the first sealing surface and the second sealing surface.

A semiconductor device according to the present disclosure includes: a package body including a mounting part having a chip mounting region for mounting a semiconductor chip, and a side wall part surrounding the chip mounting region and provided on the mounting part; and a cap, wherein a first sealing surface continuously provided over an entire perimeter of the side wall part and a second sealing surface provided on the cap and facing the first sealing surface are bonded together by a bonding member, a space enclosed by the mounting part, the side wall part and the cap is sealed, a first recess for a ball solder that is the bonding member and made of an alloy of gold and tin as principal ingredients to be placed is provided on the first sealing surface, a first solder outflow prevention part positioned closer to the space side than the first recess is continuously provided on the first sealing surface, and a second solder outflow prevention part surrounding the first recess is continuously provided on the first sealing surface.

In the present disclosure, even when using the ball solder, the ball solder can be fixed to the sealing surface in the concave package body, and thus a semiconductor device and a method for manufacturing the same which reduces defects in a PIND test can be provided.

Other and further objects, features and advantages of the invention will appear more fully from the following description.

DESCRIPTION OF EMBODIMENTS

First Embodiment

Figure 1:
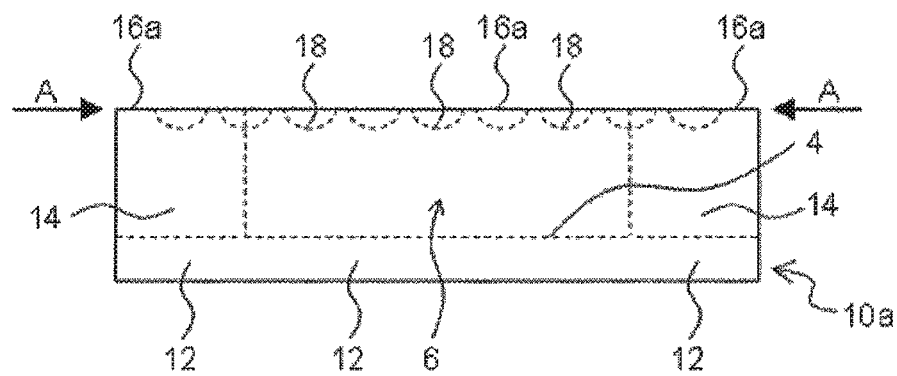
FIG. 1 is a front view of a package body according to a first embodiment.

A semiconductor device according to a first embodiment will be described with reference to the accompanying drawings.

Note that components in the drawings assigned identical reference numerals are identical or corresponding components, and this principle is commonly applicable throughout the entire text of the specification. In addition, the drawings are schematic and components may be omitted or simplified as appropriate for convenience of description. Mutual relationships between sizes and positions of components or the like shown in different drawings are not always described accurately but may be changed as appropriate.

Figure 2:
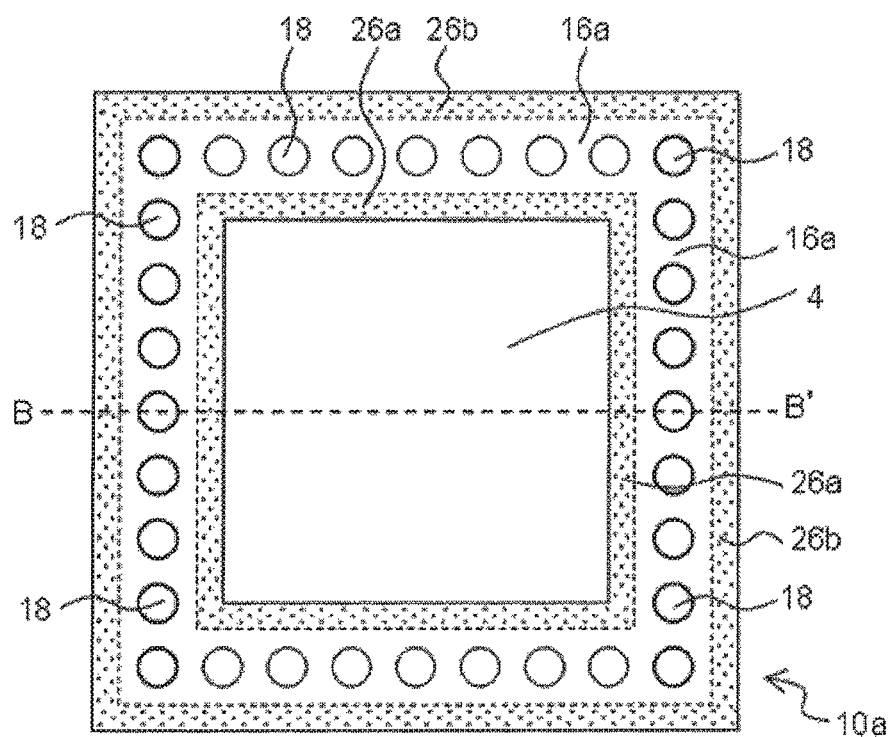
FIG. 2 is a top view of the package body according to the first embodiment.
Figure 3:
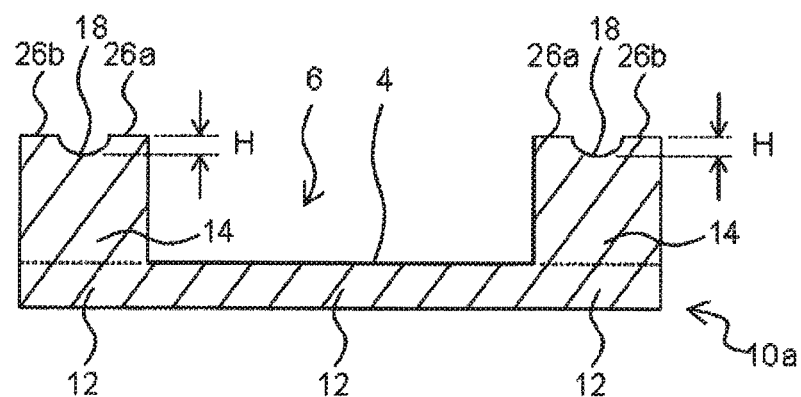
FIG. 3 is a cross-sectional view of the package body at a position B-B' in FIG. 2.

FIG. 1 is a front view of a package body 10a according to a first embodiment. FIG. 2 is a top view of the package body 10a according to the first embodiment. FIG. 3 is a cross-sectional view of the package body 10a at a position B-B' in FIG. 2.

As shown in FIGS. 1 and 2, the package body 10a includes a mounting part 12 that forms a bottom surface and a side wall part 14 provided on an outer circumference of the top surface of the mounting part 12.

The mounting part 12 is formed of a plate material made of a metal having a good heat dissipation property constructed using a material such as copper tungsten or copper molybdenum having a coefficient of linear expansion close to that of a semiconductor chip or low-cost copper material. A chip mounting region 4 is an exposed plane part which is a top surface of the mounting part 12 and is a region for mounting an electronic part.

The side wall part 14 is provided on the top surface of the mounting part 12 surrounding the chip mounting region 4. The side wall part 14 is formed by cutting a metal pipe member shaped into the form of the side wall part in advance, forming a groove into which a terminal (not shown) electrically connecting the outside and the inside of the package body 10a is fitted and bonding the side wall part 14 together with the terminal to the mounting part 12 using a brazing material.

Note that the terminal is not shown in FIG. 1 to FIG. 3, and the terminal will not be illustrated in the subsequent drawings either.

A top end of the side wall part 14 shown by an arrow A in FIG. 1 is a first sealing surface 16a. As shown in FIG. 2, the first sealing surface 16a is provided continuously without interruption over the entire circumference of the top end of the side wall part 14. The first sealing surface 16a has a nickel-plated base and a gold-plated surface.

Note that the side wall part 14 may be formed of ceramic, and although an example has been shown where the mounting part 12 and the side wall part 14 are formed as separate members, the mounting part 12 and the side wall part 14 may be formed as one.

By the way, there is a method called "in-oil atomization method" whereby a molten solder solution is dripped into oil or finely cut solder is added into oil, the solder is heated and melted, and then cooled. Ball solder obtained using the in-oil atomization method produces less oxide on the solder surface and has better solder wettability than conventional ribbon-shaped solder. Bonding the package body 91 to the cap 92 using the ball solder with good solder wettability is considered to make it possible to achieve satisfactory bonding without scrubbing the cap 92 and reduce defects in a PIND test.

However, since the ball solder has a spherical shape and the sealing surface 16a of the package body 91 is a plane surface, the ball solder may fall down without being fixed to the sealing surface 16a. For this reason, it has been difficult to seal the cap using the ball solder using the conventional method for manufacturing a semiconductor device.

On the other hand, the package body 10a according to the first embodiment is provided with a plurality of first recesses 18 allowing ball solders 60, which will be described later, to be placed thereon at a central part of the first sealing surface 16a seen from the top surface as shown in FIG. 2. In other words, the first recesses 18 are provided at the top end of the side wall part 14. Openings of the first recesses 18 seen from the top surface have a circular shape.

As shown in FIGS. 2 and 3, a first solder outflow prevention part 26a and a second solder outflow prevention part 26b are provided on the first sealing surface 16a.

The first solder outflow prevention part 26a is provided continuously over an entire perimeter of the first sealing surface 16a closer to the chip mounting region 4 side than all the first recesses 18, that is, on the side of a space 6 sealed by the mounting part 12, the side wall part 14 and a cap 92, which will be described later.

A second solder outflow prevention part 26b is provided continuously over the entire perimeter of the first sealing surface 16a surrounding all the first recesses 18. Note that the first solder outflow prevention part 26a and the second solder outflow prevention part 26b are not illustrated in FIG. 1.

The first solder outflow prevention part 26a and the second solder outflow prevention part 26b are exposed parts of nickel oxide coat having poor solder wettability.

For example, it is possible to form the first solder outflow prevention part 26a and the second solder outflow prevention part 26b by irradiating the plated first sealing surface 16a with laser light using a laser processing machine, removing the gold plating on the surface and making the nickel plating at the base exposed. In this case, the nickel plating is oxidized.

When gold plating is applied to the nickel plating at the base, the solder outflow prevention part may be masked so as to prevent only the solder outflow prevention part from being gold-plated, and then oxidation processing may be applied to the nickel plating of the solder outflow prevention part.

The solder outflow prevention part is not limited to the nickel oxide coat, but other substitutes may be used if solder wettability thereof is poor. For example, when the side wall part 14 is made of a ceramic material, the solder outflow prevention part may be constructed by exposing ceramic without applying gold plating.

Figure 4:
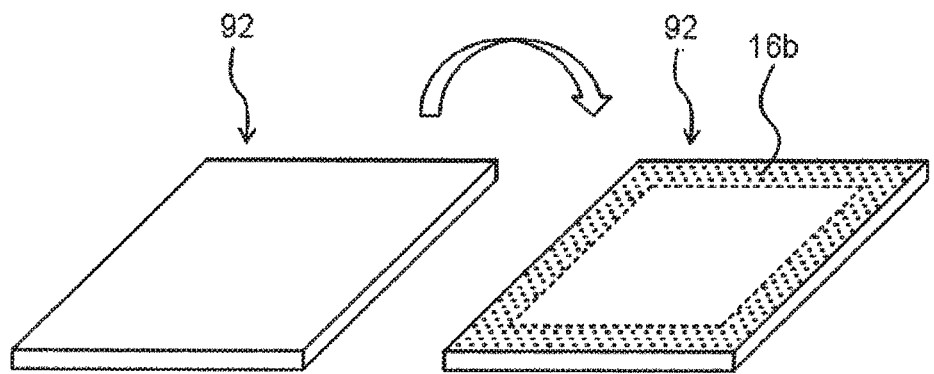
FIG. 4 is an explanatory diagram illustrating the cap.

FIG. 4 is an explanatory diagram illustrating the cap 92. A left side part of FIG. 4 illustrates a top surface of the cap 92. A right side part of FIG. 4 illustrates the cap 92 in the left side part of FIG. 4 turned upside down, illustrating an undersurface of the cap 92.

In the first embodiment, the cap 92 is a plane plate made of a metal such as kovar. The entire surface of the cap 92 has a nickel-plated base and a gold-plated surface. A second sealing surface 16b shown by dots in the right side part of FIG. 4 is a region of the undersurface of the cap 92 facing the first sealing surface 16a when the cap 92 is bonded to the package body 10a.

Note that the cap 92 may be made of metal or ceramic, and if the aforementioned plating is applied to the second sealing surface 16b, the other parts of the cap 92 may not be plated.

Next, a method for manufacturing a semiconductor device according to the first embodiment will be described.

First, when gold plating is applied to the entire first sealing surface 16a, the gold plating covering the surface of the first sealing surface 16a is irradiated with laser using a laser processing machine to form the first solder outflow prevention part 26a and the second solder outflow prevention part 26b (step S01).

A laser processing machine generally called a "laser marker" (stamping machine) which is widely available in the market can also be used. When a solder outflow prevention part is created in a manufacturing step of the package body 10a of the laser processing machine, it is necessary to cover the solder outflow prevention part with a mask first, apply plating to the package body 10a and then remove the mask. On the other hand, the method for creating the solder outflow prevention part through laser irradiation of the present disclosure eliminates the necessity for using a mask in the plating step of the package body 10a.

Next, the electronic part 2 is bonded to the chip mounting region 4 in an atmosphere with low oxygen concentration (step S02).

Next, the electronic part 2 and the terminal of the package body 10a are electrically connected via a metal wire or the like to perfect a half-finished product (step S03). Bonding of the electronic part 2 and wiring using a metal wire or the like are the same as a manufacturing step of a general semiconductor device.

Next, ball solders 60 are placed on the plurality of respective first recesses 18 of the package body 10a that constitutes the half-finished product created in this way (step S04).

Figure 5:
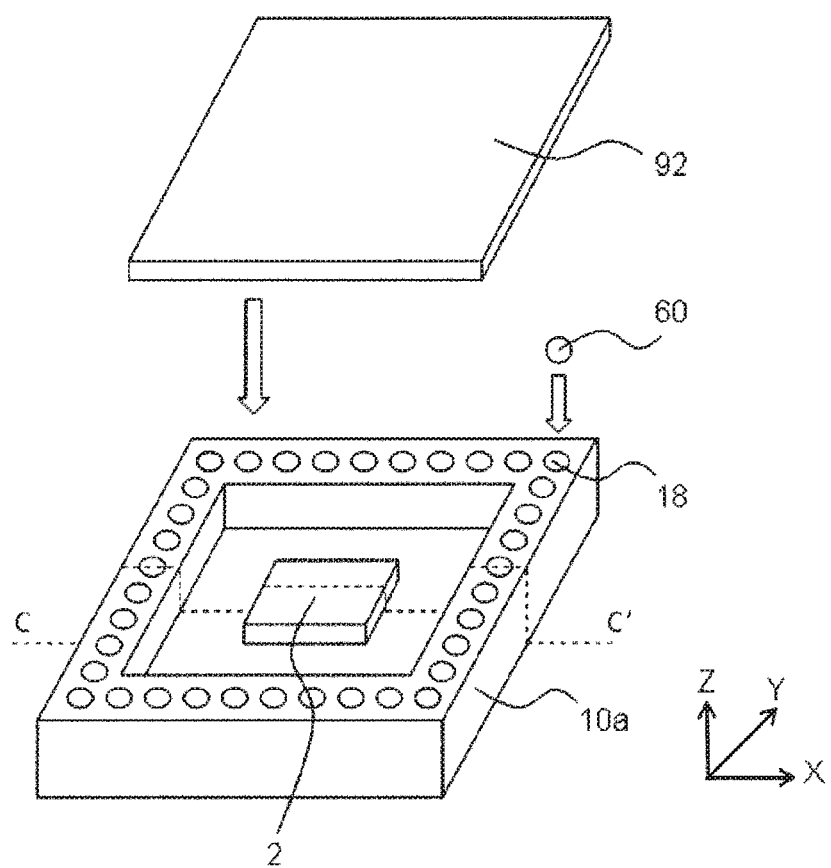
FIG. 5 is a perspective view of the half-finished product illustrating how the solder and the cap are placed.

FIG. 5 is a perspective view of the half-finished product illustrating how the solder and the cap are placed.

Figure 6A:
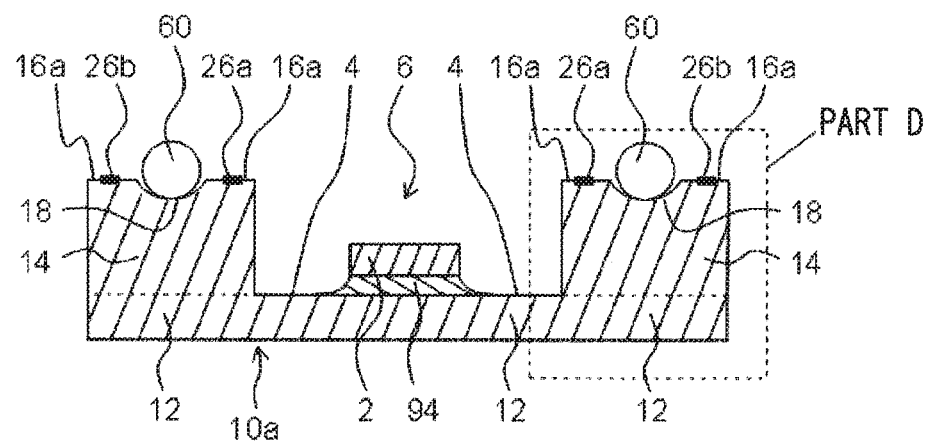
FIGS. 6A and 6B are cross-sectional views in a cross section parallel to an X-Z plane at a position C-C' in FIG. 5.
Figure 6B:
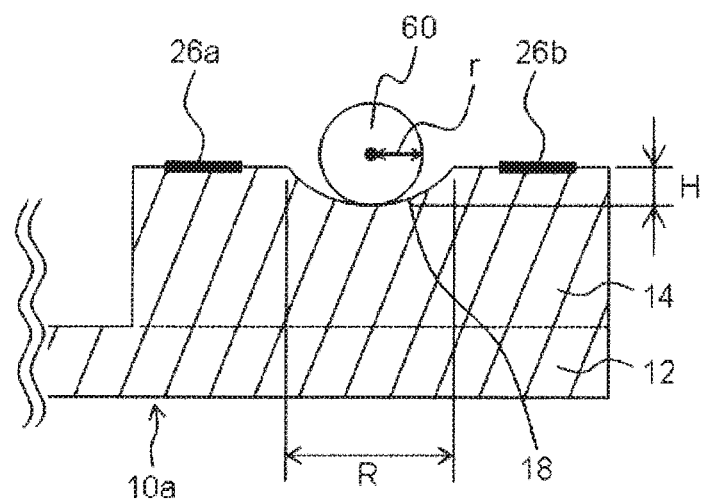

FIGS. 6A and 6B are cross-sectional views in a cross section parallel to an X-Z plane at a position C-C' in FIG. 5 illustrating a state after placing the ball solders 60 on the half-finished product. FIG. 6A is a diagram illustrating the entire half-finished product and FIG. 6B is an enlarged view of a part D in FIG. 6A.

As shown in FIG. 6A, the electronic part 2 is bonded to the chip mounting region 4 by solder 94. The electronic part 2 includes a semiconductor chip, which is an active element. Examples of the semiconductor chip include transistor, IC, and MMIC (Monolithic Microwave Integrated Circuit) formed on a substrate of nitride gallium (GaN), gallium arsenide (GaAs), Si, silicon germanium (SiGe) or the like. The electronic part 2 may be singular or plural, or may include a planar circuit formed on a ceramic substrate, passive element such as a resistor, capacitor or inductor, or chip part. The electronic part 2 and the terminal (not shown) of the package body 10a are electrically connected via a metal wire (not shown) or the like.

The solder 94 is high temperature solder for use with high reliability such as gold/tin (Au—Sn) solder, gold germanium (Au—Ge) solder. These materials neither use a flux for bonding nor cause reliability deterioration due to an outgas.

The ball solder 60 is a bonding member for bonding the first sealing surface 16a and the second sealing surface 16b, and is substantially spherical solder manufactured using an in-oil atomization method. The ball solder 60 is an alloy made of gold and tin as principal ingredients and does not include any flux. Each ball solder 60 has a smaller surface area per volume than a conventional ribbon shape, is formed into a ball shape when quickly cooled in oil due to the manufacturing method from a liquid state and solidified, and so each ball solder 60 has a fine lamellar composition and exhibits good solder wettability. As long as good solder wettability can be secured, the manufacturing method for ball solder is not limited to the in-oil atomization method but other manufacturing methods may also be used.

The shape of the first recesses 18 is set so as to prevent the ball solders 60 from easily moving or falling off the sealing surface. As shown in FIG. 2, the shape of the opening of the first recesses 18 in a plan view is circular. As shown in FIG. 6B, a diameter R of the first recesses 18 is slightly greater than twice a radius r of the ball solder 60, and a cross section of the first recesses 18 is an arcuate or bowl-like, smoothly downward convex shape. A depth H of the first recesses 18 is set to be slightly smaller than the radius r of the ball solder 60. More specifically, the depth H of the first recesses 18 is preferably 0.7 times or more and 0.9 times or less of r.

Thus, the shape of the first recesses 18 is set appropriately, and so the ball solder 60 can be stably placed in the first recesses 18 in step S04. Note that the shape of the opening of the first recesses 18 is circular, and being circular has an advantage that the opening of the first recesses 18 can be easily formed through cutting, but the shape of the opening of the first recesses 18 need not always be circular as long as it has a shape that allows the ball solder 60 to be stably placed.

Next, the cap 92 is placed on the ball solders 60 (step S05). Since the shape of the first recesses 18 is set appropriately, the cap 92 can be placed stably.

Next, the half-finished product in which the ball solders 60 and the cap 92 are placed in an atmosphere with low oxygen concentration is heated once and the ball solder 60 is melted (step S06).

The molten ball solders 60 become wet to spread along the first sealing surface 16a provided continuously over the entire perimeter of the side wall part 14. After that, the package body 10a and the cap 92 are bonded together and hermetically sealed with solder 61, which corresponds to the ball solder 60 cooled and resolidified (step S07). For heating or cooling, it is possible to use a reflow furnace, a heater or the like placed, for example, in a nitrogen atmosphere or in an environment in which a nitrogen gas is made to flow at a constant flow rate.

Note that the cap 92 may be placed after moving the half-finished product in which the ball solders 60 are placed in the plurality of first recesses 18 respectively to a reflow furnace, a heater or the like. By appropriately setting the shape of the first recesses 18 as in the case of the first embodiment, it is possible to prevent the ball solders 60 from falling off the first recesses 18 due to vibration during the movement.

Figure 7:
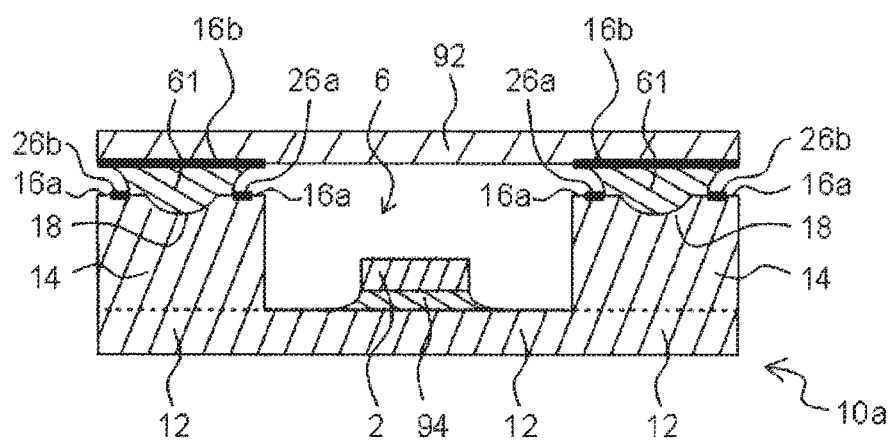
FIG. 7 is a cross-sectional view of the semiconductor device according to the first embodiment after sealing.

FIG. 7 is a cross-sectional view of the semiconductor device according to the first embodiment after sealing, illustrating a cross section of the plane parallel to the X-Z plane at the position C-C' in FIG. 5.

As shown in FIG. 7, the first sealing surface 16a and the second sealing surface 16b face each other and are bonded by the solder 61. The space 6 enclosed by the mounting part 12, the side wall part 14 and the cap 92 are hermetically sealed.

As described above, the ball solder 60 has good solder wettability. The first solder outflow prevention part 26a and the second solder outflow prevention part 26b are formed of an exposed nickel oxide coat having poor solder wettability.

Thus, the molten ball solder 60 becomes wet to spread over the gold-plated first sealing surface 16a between the first solder outflow prevention part 26a and the second solder outflow prevention part 26b without scrubbing.

On the other hand, the molten ball solder 60 never becomes wet to spread beyond the first solder outflow prevention part 26a and the second solder outflow prevention part 26b.

That is, according to the present disclosure, when hermetically sealing the cap 92 and the package body 10a, it is possible to achieve bonding with good hermetic sealability without scrubbing. This prevents generation of solder fragments and exerts an effect of suppressing defects in a PIND test. In addition, this eliminates outflow of the solder 61 to the outer side face of the package body 10a and exerts an effect of suppressing defects in an appearance inspection.

As described above, the semiconductor device according to the first embodiment is provided with the package body 10a having the mounting part 12 having the chip mounting region 4 for mounting a semiconductor chip and the side wall part 14 surrounding the chip mounting region 4 provided in the mounting part 12 and the cap 92. This is the semiconductor device in which the first sealing surface 16a provided continuously over the entire perimeter of the side wall part 14 and the second sealing surface 16b provided on the cap 92 and facing the first sealing surface 16a are bonded together by a bonding member, and the space 6 enclosed by the mounting part 12, the side wall part 14 and the cap 92 is sealed.

Here, the first recesses 18 for the ball solders 60 that is the bonding member and made of an alloy of gold and tin as principal ingredients to be placed is provided on the first sealing surface 16a, the first solder outflow prevention part 26a positioned closer to the space 6 side than the first recesses 18 is continuously provided on the first sealing surface 16a, and the second solder outflow prevention part 26b surrounding the first recesses 18 is continuously provided on the first sealing surface 16a. The first solder outflow prevention part 26a and the second solder outflow prevention part 26b are nickel oxide coats.

The method for manufacturing a semiconductor device according to the first embodiment includes a step of providing the package body 10a including the mounting part 12 including the chip mounting region 4 for mounting a semiconductor chip, the side wall part 14 including the first sealing surface 16a continuously provided over the entire perimeter of the mounting part 12, surrounding the chip mounting region 4 and provided on the mounting part 12, the first recesses 18 provided on the first sealing surface 16a, and the first solder outflow prevention part 26a continuously provided on the first sealing surface 16a and positioned closer to the chip mounting region 4 side than the first recesses 18, a step of providing the cap 92 having the second sealing surface 16b facing the first sealing surface 16a, a step of providing the ball solders 60 made of an alloy of gold and tin as principal ingredients, a step of placing the ball solders 60 in the first recesses 18, a step of placing the cap 92 on the ball solders 60 placed earlier and a hermetically sealing step of melting once and then solidifying the ball solders 60 to bond the first sealing surface 16a and the second sealing surface 16b.

According to such a configuration, since the first recesses 18 in which the ball solders 60 can be placed are provided on the first sealing surface 16a, it is possible to fix the ball solders 60 to the first sealing surface 16a without the ball solders 60 falling off. Therefore, it is possible to use the ball solders 60 with good solder wettability for bonding the package body 10a and the cap 92, and thereby hermetically seal the semiconductor device satisfactorily without scrubbing. As a result, it is possible to suppress dropping of solder fragments into the hermetically sealed space 6 and exert an effect of reducing defects in a PIND test.

Furthermore, the first solder outflow prevention part 26a is provided inside the first recesses 18 and the second solder outflow prevention part 26b is provided outside. This exerts an effect of eliminating the outflow of solder to the side face of the package body 10a and suppressing defects in appearance.

Not that the quantities of the first recesses 18 and the ball solders 60 placed in the first recesses 18 need only to be quantities enough to cover the entire sealing surface when the ball solders 60 are melted, and the ball solders 60 need not always be placed in all the first recesses 18.

In the first embodiment, although an example has been described where the shape of the opening of the first recesses 18, seen from the top surface is circular and the vertical cross section is an arcuate or bowl-like smoothly downward convex shape, the shape of the first recesses 18 is not always limited to this. Any shape such as an elliptical, conic, cylindrical, pyramidal, or rectangular parallelepiped shape may be adopted as long as the ball solders 60 do not easily move or fall off the sealing surface.

Second Embodiment

A second embodiment will be described.

A difference between the first embodiment and the second embodiment lies in that while a plurality of first recesses 18 are provided on the first sealing surface 16a in the package body 10a according to the first embodiment, the first groove 22 is provided in the first sealing surface 16a instead of the first recesses 18 in the package body 10b according to the second embodiment.

Figure 8A:
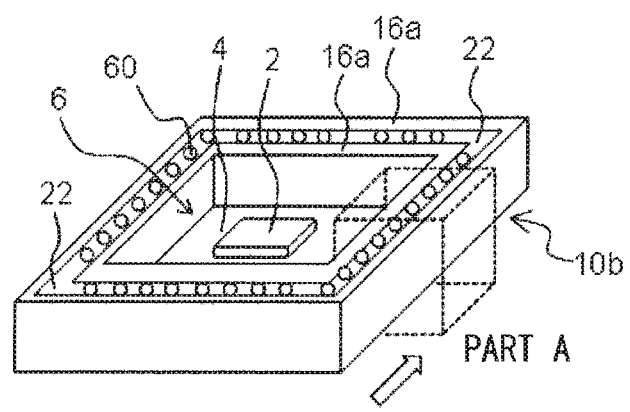
FIGS. 8A and 8B are perspective views of a half-finished product of a semiconductor device according to the second embodiment.
Figure 8B:
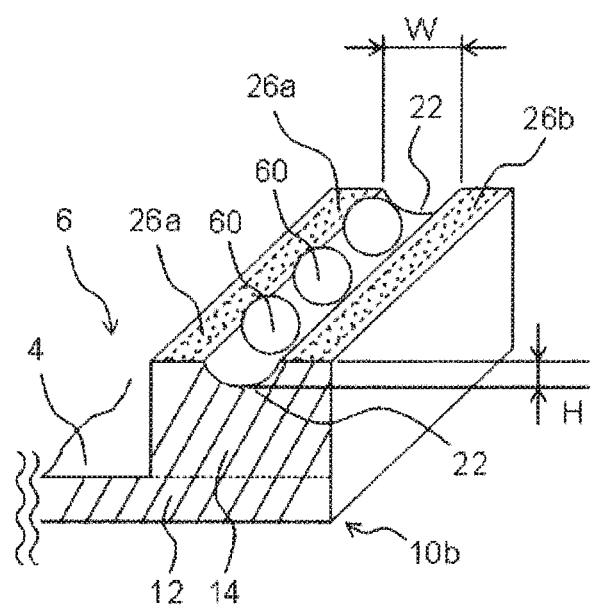

FIGS. 8A and 8B are perspective views of a half-finished product of a semiconductor device according to the second embodiment. FIG. 8A is a perspective view of the package body 10b according to the second embodiment to which the electronic part 2 is bonded and on which the ball solders 60 are placed later. FIG. 8B is an enlarged view of a part A shown by a dotted line in FIG. 8A seen from a direction indicated by an arrow.

As shown in FIG. 8A, a first groove 22 is provided continuously over the entire perimeter of the first sealing surface 16a. As shown in FIG. 8B, the first solder outflow prevention part 26a and the second solder outflow prevention part 26b are provided on the first sealing surface 16a. Note that neither the first solder outflow prevention part 26a nor the second solder outflow prevention part 26b is shown in FIG. 8A.

The first solder outflow prevention part 26a is provided closer to the chip mounting region 4 side than the entire first groove 22, that is, on the side of the space 6 sealed by the mounting part 12, the side wall part 14 and the cap 92. The second solder outflow prevention part 26b is provided continuously so as to surround the entire first groove 22 over the entire perimeter of the first sealing surface 16a.

The shape of the first groove 22 is set in such a way as to prevent the ball solders 60 from easily falling off the sealing surface as in the case of the shape of the first recesses 18. A width W of the first groove 22 seen from the top surface is slightly greater than two times the radius r of the ball solder 60. A cross section of the first groove 22 is an arcuate or bowl-like smoothly downward convex shape and a depth H of the first groove 22 is set to be slightly smaller than the radius r of the ball solder 60. More specifically, the depth H of the first groove 22 is preferably 0.7 times or more and 0.9 times or less of r.

The other parts are the same as those of the first embodiment and description thereof is omitted.

In the second embodiment configured as described above as in the case of the first embodiment, it is possible to fix the ball solders 60 with good solder wettability without falling down, favorably bond and hermetically seal the package body 10b and the cap 92 without scrubbing. Thus, it is possible to suppress dropping of solder fragments into the hermetically sealed space 6 and exert an effect of reducing defects in a PIND test. Furthermore, the first solder outflow prevention part 26a is provided inside the first groove 22 and the second solder outflow prevention part 26b is provided outside, and this exerts an effect of eliminating solder outflow to the side face of the package body 10b and suppressing defects in appearance.

Moreover, there is an effect that processing during formation of the first groove 22 is easier than processing during formation of the first recesses 18 on the first sealing surface 16a, and the ball solders 60 are more easily placed. There is also an effect that the molten ball solders 60 can easily spread over the entire perimeter of the package body 10b along the first groove 22.

Third Embodiment

A third embodiment will be described.

The first solder outflow prevention part 26a and the second solder outflow prevention part 26b are provided on the first sealing surface 16a of the package body 10a according to the first embodiment. On the other hand, a first step 28a and a second step 28b are provided on the first sealing surface 16a instead of these parts in a package body 10c according to the third embodiment. This is the only difference between the third embodiment and the first embodiment. The other parts are the same.

Figure 9A:
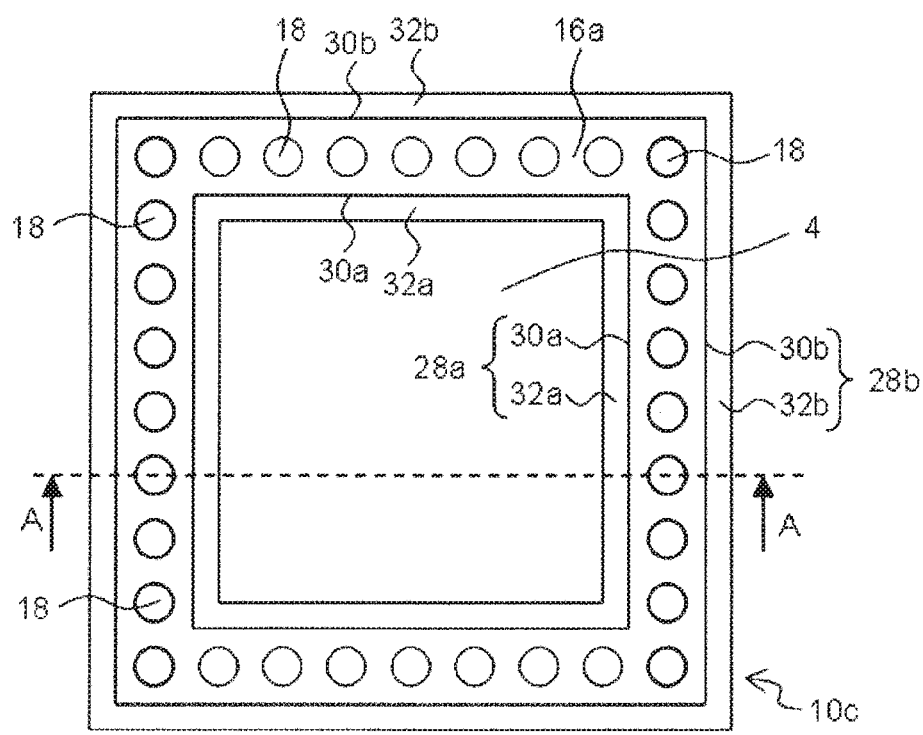
FIG. 9A is a top view of the package body according to the third embodiment.
Figure 9B:
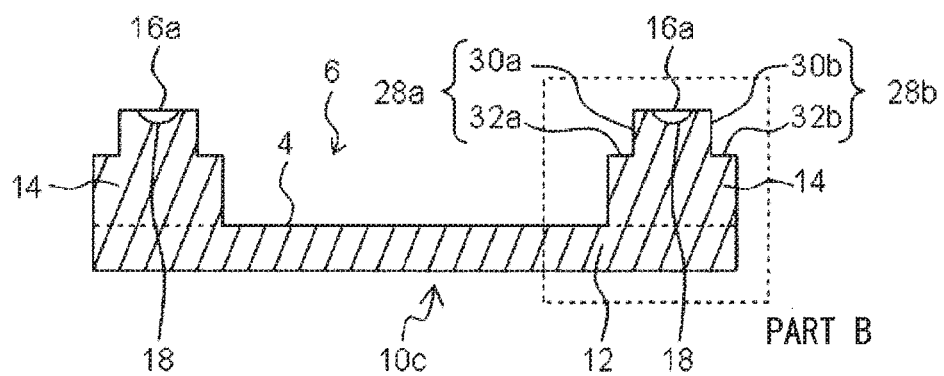
FIG. 9B is a cross-sectional view of the package body according to the third embodiment.

FIGS. 9A and 9B are a top view and a cross-sectional view of the package body 10c according to the third embodiment. FIG. 9A is a top view and FIG. 9B is a cross-sectional view of the package body 10c seen from an arrow A in FIG. 9A.

As in the case of the package body 10a, the package body 10c includes the mounting part 12 including the chip mounting region 4 for mounting a semiconductor chip and the side wall part 14 surrounding the chip mounting region 4 provided in the mounting part 12. An upper part of the chip mounting region 4 corresponds to the space 6. A top surface of the side wall part 14 is the first sealing surface 16a. The first recesses 18 in which the ball solders 60 can be placed are provided on the first sealing surface 16a. The first step 28a and the second step 28b are provided on the first sealing surface 16a.

The first step 28a is a stepped part having a side face 30a and a bottom surface 32a one step below the first sealing surface 16a. The first step 28a is provided continuously without any break over the entire perimeter of the side wall part 14 at an edge inside the first sealing surface 16a. This is positioned closer to the chip mounting region side than the first recesses 18, that is, the side of the space 6 sealed by the mounting part 12, the side wall part 14 and the cap 92. In other words, the side face 30a and the bottom surface 32a are positioned closer to the chip mounting region 4 than the first sealing surface 16a.

The second step 28b is provided continuously without any break over the entire perimeter of the side wall part 14 at an edge outside the first sealing surface 16a and surrounding the first recesses 18.

The second step 28b is a stepped part including a side face 30b and a bottom surface 32b one step below the first sealing surface 16a. In other words, the side face 30b and the bottom surface 32b are positioned closer to the mounting part 12 than the first sealing surface 16a.

In the third embodiment as in the case of the first embodiment, a half-finished product is manufactured using the package body 10c (steps S02 and S03), the ball solders 60 are then placed in the plurality of respective first recesses 18 of the package body 10c constituting the half-finished product (step S04), and the cap 92 is placed on the ball solders 60 (step S05). Next, the whole body is heated, and the package body 10c and the cap 92 are bonded together by solders 61, which are the ball solders 60 melted once (step S06), cooled and solidified again, and the semiconductor device is hermetically sealed (step S07).

Figure 10A:
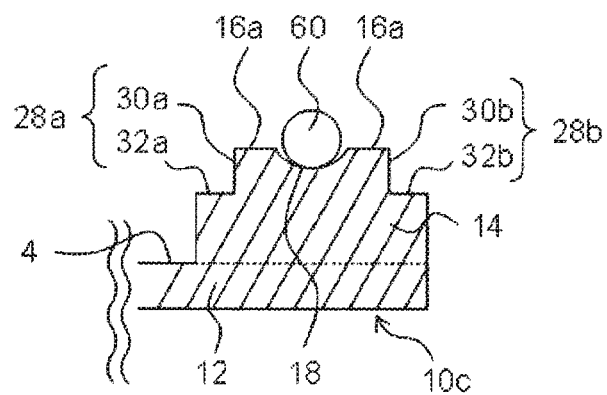
FIGS. 10A and 10B are cross-sectional views of the semiconductor device according to the third embodiment.
Figure 10B:
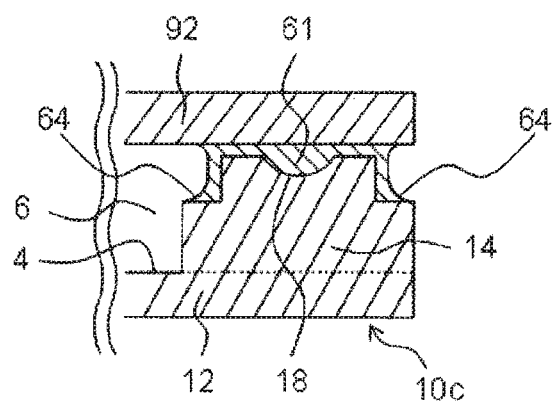

FIGS. 10A and 10B are cross-sectional views of the semiconductor device according to the third embodiment. FIG. 10A is a cross-sectional view at the position of a part B in FIG. 9B seen in step S04 and FIG. 10B is a cross-sectional view at the position of the part B in FIG. 9B seen in step S07.

As shown in FIG. 10B, the package body 10c and the cap 92 are coupled by solder 61, which is the ball solder 60 melted once and solidified again. The package body 10c is provided with neither the first nor the second solder outflow prevention part. Therefore, the molten ball solders 60 may possibly flow from the first sealing surface 16a of the package body 10c into or out of the package.

However, the package body 10c is provided with the first step 28a and the second step 28b so as to facilitate formation of a fillet 64. Thus, the solder that has flowed out forms the fillet 64 on the bottom surfaces 32a and 32b.

By forming the fillet 64, the first step 28a and the second step 28b cause the solder that has flowed out to remain around the first step 28a and the second step 28b and reduce solder outflow to the side face of the package body 10c. The steps have an effect of suppressing defects in appearance.

Note that to facilitate the formation of the fillet 64, heights of the first step 28a and the second step 28b are preferably on the order of 0.5 mm.

The other parts are the same as those of the first embodiment and description thereof is omitted.

In the third embodiment configured as described above as in the case of the first embodiment, it is possible to fix the ball solders 60 with good solder wettability without falling down, favorably bond and hermetically seal the package body 10a and the cap 92 without scrubbing. Thus, it is possible to suppress dropping of solder fragments in the hermetically sealed space 6 and thereby exert an effect of reducing defects in a PIND test.

Since the first step 28a is provided inside the first recesses 18 and the second step 28b is provided outside, it is possible to exert an effect of eliminating solder outflow to the side face of the package body 10c and suppressing defects in appearance.

Fourth Embodiment

Figure 11A:
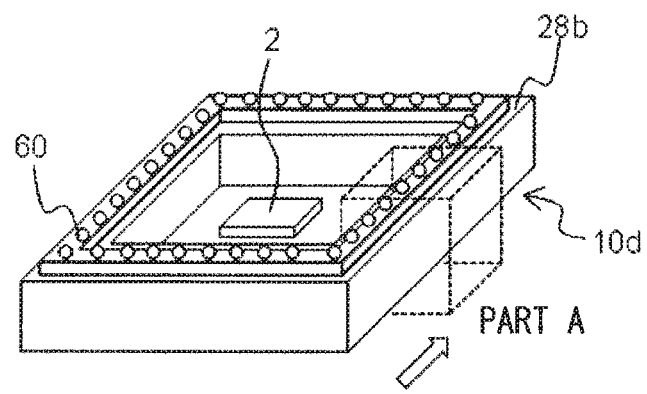
FIGS. 11A and 11B are perspective views of a half-finished product of a semiconductor device according to the fourth embodiment.
Figure 11B:
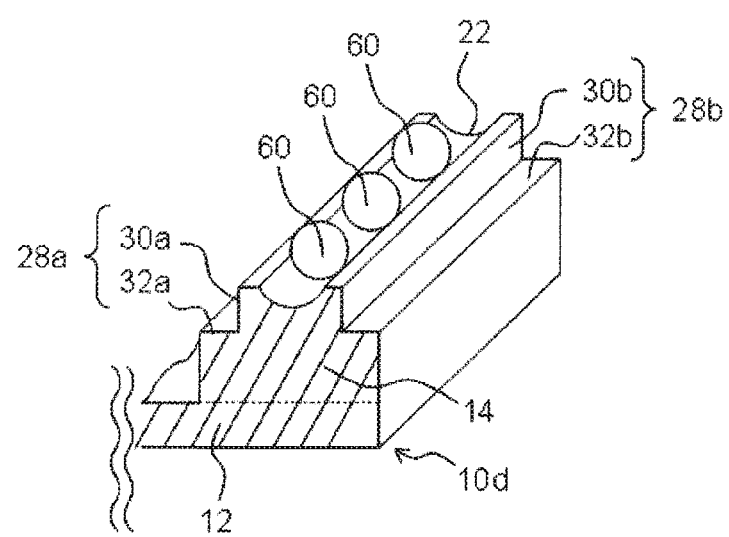

A fourth embodiment will be described. FIGS. 11A and 11B are perspective views of a half-finished product of a semiconductor device according to the fourth embodiment. FIG. 11A is a perspective view of the device after the ball solders 60 are placed on a package body 10d to which the electronic part 2 is bonded. FIG. 11B is an enlarged view of a part A shown by a dotted line in FIG. 11A seen from a direction indicated by an arrow.

The package body 10d according to the fourth embodiment includes the first groove 22 on the first sealing surface 16a as in the case of the package body 10b according to the second embodiment. In the package body 10d according to the fourth embodiment as in the case of the package body 10c according to the third embodiment, the first step 28a and the second step 28b are provided on the first sealing surface 16a.

The other parts are similar to those in the second or third embodiment, and so description thereof is omitted.

In the fourth embodiment configured as described above as in the case of the first embodiment, it is possible to fix the ball solders 60 with good solder wettability without the ball solders 60 falling down, favorably bond and hermetically seal the package body 10a and the cap 92 without scrubbing. Thus, it is possible to suppress dropping of solder fragments in the hermetically sealed space 6 and exert an effect of reducing defects in a PIND test.

Since the first step 28a is provided inside the first recesses 18 and the second step 28b is provided outside, it is possible to exert an effect of eliminating solder outflow to the side face of the package body 10c and suppressing defects in appearance.

Furthermore, the first groove 22 is adopted instead of the first recesses 18. This exerts an effect that processing during formation of the first groove 22 is easier than processing during formation of the first recesses 18 on the first sealing surface 16a, and the ball solders 60 are more easily placed.

Fifth Embodiment

A fifth embodiment will be described.

Figure 12A:
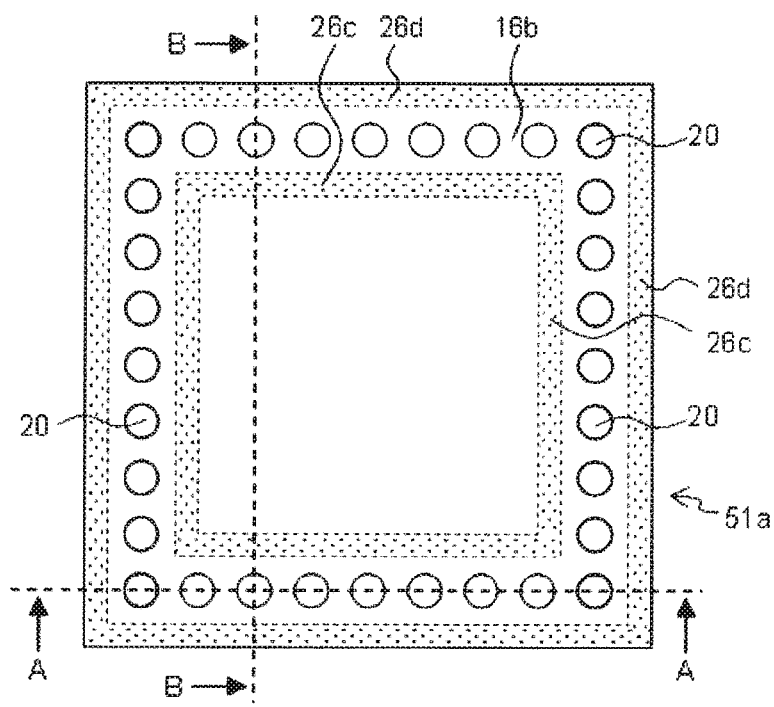
FIGS. 12A, 12B and 12C are diagrams illustrating a cap according to a fifth embodiment.
Figure 12B:
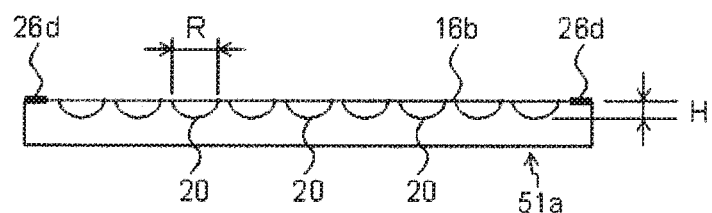
Figure 12C:
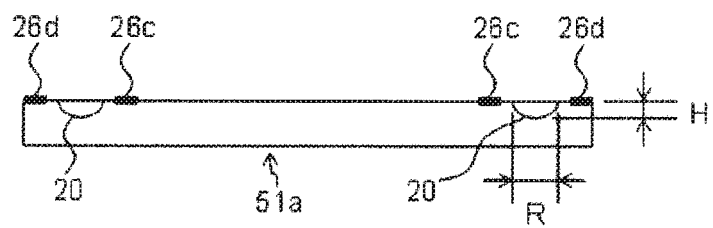

FIGS. 12A, 12B and 12C are diagrams illustrating a cap 51a according to a fifth embodiment. FIG. 12A is a top view of the cap 51a turned upside down. That is, FIG. 12A illustrates an undersurface of the cap 51a. FIG. 12B is a cross-sectional view seen from an arrow A in FIG. 12A and FIG. 12C is a cross-sectional view seen from an arrow B.

A difference between the cap 92 and the cap 51a lies in that second recesses 20, a third solder outflow prevention part 26c and a fourth solder outflow prevention part 26d are provided on the second sealing surface 16b set on the undersurface of the cap 51a. The other parts are the same.

As in the case of the cap 92, the cap 51a is a plane plate made of metal such as kovar. Over the entire surface of the cap 51 except the third solder outflow prevention part 26c and the fourth solder outflow prevention part 26d, nickel plating is applied to the base and gold plating is applied to the surface. Note that the material of the cap 51a may be metal or ceramic and as long as the aforementioned plating is applied to the second sealing surface 16b, plating may not be applied to the other parts.

As shown in FIG. 12A, a plurality of second recesses 20 on which ball solders can be placed are provided at a central part of the second sealing surface 16b of the cap 51a. The shape of the second recesses 20 is set in such a way as to prevent the ball solders 60 from easily moving or falling off the sealing surface. The shape of the opening of the second recesses 20 in a plan view is circular and a diameter R thereof is slightly greater than twice the radius r of the ball solder 60. When the shape of the opening is circular, there is an advantage that the opening can be easily formed by cutting, but the shape of the opening need not always be circular.

As shown in FIGS. 12B and 12C, a cross section of the second recesses 20 is an arcuate or bowl-like smoothly downward convex shape and a depth H of the second recesses 20 is set to be slightly smaller than the radius r of the ball solder 60. More specifically, the depth H of the second recesses 20 is preferably 0.7 times or more and 0.9 times or less of r.

As shown in FIG. 12A, the third solder outflow prevention part 26c and the fourth solder outflow prevention part 26d are provided on the second sealing surface 16b. The third solder outflow prevention part 26c is provided continuously over the entire perimeter of the second sealing surface 16b closer to the side of the chip mounting region 4 than all the second recesses 20, that is, on the side of the space 6 sealed by the mounting part 12, the side wall part 14 and the cap 51a. The fourth solder outflow prevention part 26d is provided continuously over the entire perimeter of the second sealing surface 16b by surrounding all the second recesses 20.

As in the cases of the first solder outflow prevention part 26a and the second solder outflow prevention part 26b, the third solder outflow prevention part 26c and the fourth solder outflow prevention part 26d are exposed parts of nickel oxide coats with poor solder wettability. For example, these parts can be formed by irradiating the plated second sealing surface 16b with laser light using a laser processing machine, removing the gold plating from the surface and exposing nickel plating at the base. In this case, the nickel plating is oxidized. When gold plating is applied to the nickel plating at the base, the solder outflow prevention part may be formed by masking the solder outflow prevention part to prevent only the solder outflow prevention part from being gold-plated, and then applying oxidation processing to the nickel plating of the solder outflow prevention part. The solder outflow prevention part is not limited to the nickel oxide coats, but other substitutes may be used as long as solder wettability thereof is poor. For example, when the cap 51a is made of a ceramic material, the solder outflow prevention part may be constructed by exposing the ceramic base material without applying gold plating thereto.

Next, a method for manufacturing a semiconductor device according to a fifth embodiment will be described.

First, when gold plating is applied to the entire second sealing surface 16b, the gold plating covering the surface of the second sealing surface 16b is irradiated with laser using a laser processing machine to form the third solder outflow prevention part 26c and the fourth solder outflow prevention part 26d (step S11).

Next, the electronic part 2 is bonded to the chip mounting region 4 of the package body 91 in an atmosphere with low oxygen concentration (step S12). Next, the electronic part 2 and the terminal of the package body 91 are electrically connected using a metal wire or the like to create a half-finished product 40 (step S13). Bonding of the electronic part 2 and wire connection using a metal wire or the like are the same as a manufacturing step of a general semiconductor device.

Figure 13:
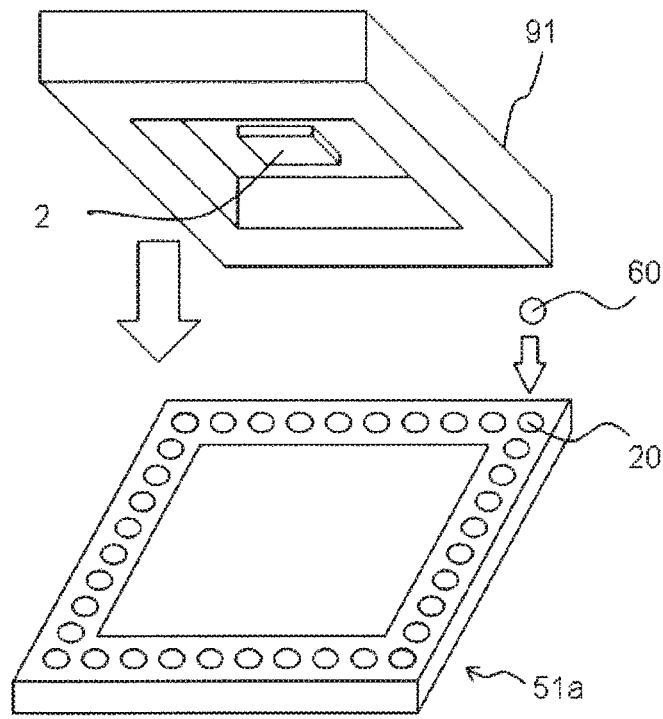
FIG. 13 is a perspective view illustrating how solder and a half-finished product are placed on the cap.

Next, as shown in FIG. 13, the undersurface of the cap 51a is turned up and ball solders 60 are placed on the plurality of respective second recesses 20 (step S14). FIG. 13 is a perspective view illustrating how solder and a half-finished product according to the fifth embodiment are placed on the cap.

Since the shape of the second recesses 20 is set appropriately, the ball solders 60 can be placed stably in the second recesses 20.

Next, the half-finished product 40 is placed on the ball solders 60 placed on the cap 51a, the half-finished product 40 being turned upside down and the first sealing surface 16a facing down (step S15).

Since the shape of the second recesses 20 is set appropriately, it is possible to stably place the half-finished product 40 on the ball solder 60.

Next, the cap 51a on which the ball solders 60 are placed in an atmosphere with low oxygen concentration, the ball solders 60 and the half-finished product are heated once, and the ball solders 60 are melted (step S16).

After that, the whole body is cooled, the ball solders 60 are solidified again, the package body 91 and the cap 51a are bonded together and hermetically sealed with the resolidified solder 61 (step S17).

For heating or cooling, it is possible to use a reflow furnace, a heater or the like placed, for example, in a nitrogen atmosphere or in an environment in which a nitrogen gas is made to flow at a constant flow rate.

Note that the half-finished product 40 may be placed after moving the cap 51a in which the ball solders 60 are placed in the second recesses 20 to a reflow furnace, a heater or the like. By appropriately setting the shape of the second recesses 20, the ball solders 60 never drop off from the second recesses 20 due to vibration during the movement. The ball solders 60 may be placed on the plurality of respective second recesses 20 in a reflow furnace, heater or the like before heating, and further the half-finished product 40 may be placed.

Figure 14:
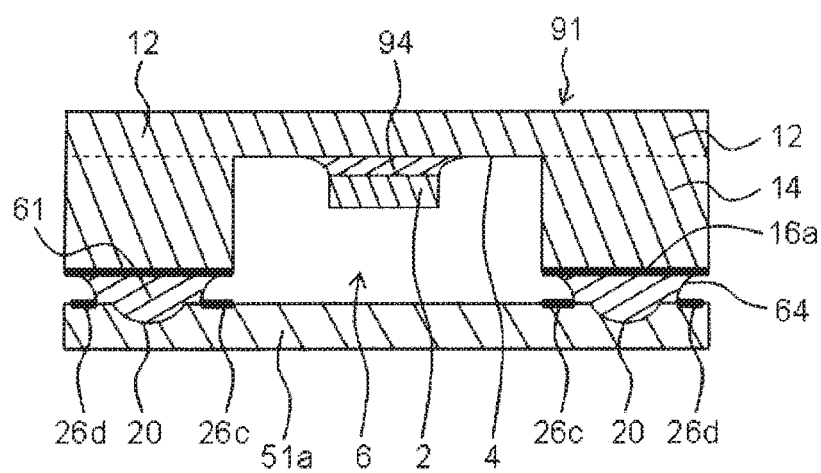
FIG. 14 is a cross-sectional view of the semiconductor device according to the fifth embodiment.

FIG. 14 is a cross-sectional view of the semiconductor device according to the fifth embodiment. FIG. 14 illustrates a state immediately after step S17, and a package body 91 is positioned on the cap 51a. The first sealing surface 16a and the second sealing surface 16b face each other and are bonded by the solder 61. The space 6 enclosed by the mounting part 12, the side wall part 14 and the cap 51a is hermetically sealed.

As described above, the third solder outflow prevention part 26c and the fourth solder outflow prevention part 26d are formed of exposed nickel oxide coats with poor solder wettability. The ball solders 60 exhibit high solder wettability. Therefore, the molten ball solders 60 become wet to spread over the gold-plated second sealing surface 16b between the third solder outflow prevention part 26c and the fourth solder outflow prevention part 26d without scrubbing. On the other hand, the molten ball solder 60 never becomes wet to spread beyond the third solder outflow prevention part 26c and the fourth solder outflow prevention part 26d.

That is, according to the present disclosure, when hermetically sealing the cap 51a and the package body 91, it is possible to achieve bonding with good hermetical sealing without scrubbing. This exerts an effect of suppressing the generation of solder fragments and suppressing defects in a PIND test. This also exerts an effect of eliminating the outflow of the solder 61 to the outer side face of the cap 51a and thereby suppressing defects in an appearance inspection. Description of the other parts is omitted.

As described above, the semiconductor device according to the fifth embodiment is a semiconductor device including the package body 91 having the mounting part 12 having the chip mounting region 4 for mounting a semiconductor chip and the side wall part 14 surrounding the chip mounting region 4 provided in the mounting part 12 and the cap 51a, in which the first sealing surface 16a provided continuously over the entire perimeter of the side wall part 14 and the second sealing surface 16b provided on the cap 51a and facing the first sealing surface 16a are bonded together by a bonding member, and the space 6 enclosed by the mounting part 12, the side wall part 14 and the cap 51a is sealed.

Here, the second recesses 20 in which the ball solders 60, a bonding member made of an alloy of gold and tin as principal ingredients can be placed, the continuous third solder outflow prevention part 26c positioned closer to the space 6 than the second recesses 20 and the continuous fourth solder outflow prevention part 26d surrounding the second recesses 20 are provided on the second sealing surface 16b. The third solder outflow prevention part 26c and the fourth solder outflow prevention part 26d are nickel oxide coats.

The method for manufacturing a semiconductor device according to the fifth embodiment includes a step of providing the package body 91 including the mounting part 12 having the chip mounting region 4 for mounting a semiconductor chip and the side wall part 14 including the first sealing surface 16a continuously provided over the entire perimeter, surrounding the chip mounting region 4 and provided on the mounting part 12, a step of providing the cap 51a including the second sealing surface 16b facing the first sealing surface 16a, the second recesses 20 on the second sealing surface 16b, and the third solder outflow prevention part 26c continuously provided on the second sealing surface 16b and positioned closer to the chip mounting region 4 side than the second recesses 20, a step of providing the ball solders 60 made of an alloy of gold and tin as principal ingredients, a step of placing ball solders 60 in the second recesses 20, a step of placing the package body 91 on the ball solders 60 and a hermetically sealing step of melting once and then solidifying the ball solders 60 to bond the first sealing surface 16a and the second sealing surface 16b.

According to such a configuration, the second recesses 20 in which the ball solders 60 can be placed are provided on the second sealing surface 16b of the cap 51a, and so the ball solders 60 can be fixed without falling down. That is, it is possible to use the ball solders 60 with good solder wettability for bonding the package body 91 and the cap 51a, and the semiconductor device can be hermetically sealed satisfactorily without scrubbing. As a result, it is possible to suppress dropping of solder fragments into the hermetically sealed space 6, which exerts an effect of reducing defects in a PIND test.

Furthermore, the third solder outflow prevention part 26c is provided inside the second recesses 20 and the fourth solder outflow prevention part 26d is provided outside, which exerts an effect of preventing solder from flowing into or out of the package body 91.

Note that the quantities of second recesses 20 and the ball solders 60 placed in the second recesses 20 need only to be quantities enough to cover the entire sealing surface when the ball solder 60 is melted, and need not necessarily be placed in all the second recesses 20. Although an example has been described where regarding the shape of the second recesses 20, the shape of the opening in a plan view is circular and the vertical cross section is an arcuate or bowl-like smoothly downward convex shape, the shape of the second recesses 20 is not necessarily limited to this. Any shape such as a conic, cylindrical, or rectangular parallelepiped shape may be adopted as long as the ball solder 60 does not easily move or fall down from the sealing surface.

Sixth Embodiment

Figure 15A:
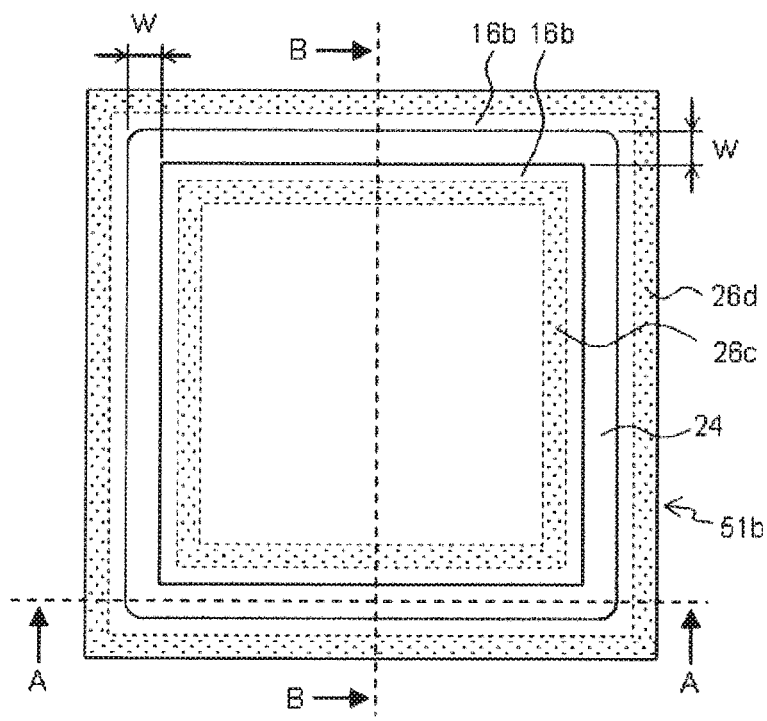
FIGS. 15A, 15B and 15C are diagrams illustrating a cap according to the sixth embodiment.
Figure 15B:
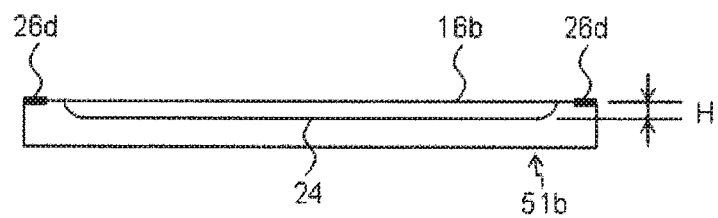
Figure 15C:
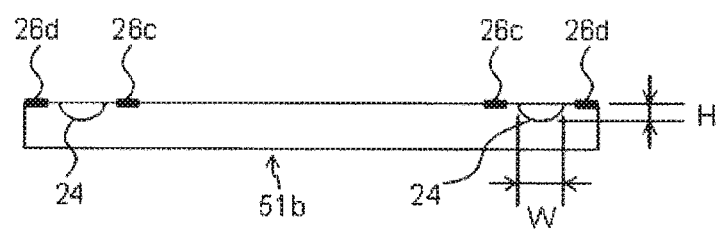

A sixth embodiment will be described. FIGS. 15A, 15B and 15C are diagrams illustrating a cap 51b according to the sixth embodiment. FIG. 15A is a top view of the cap 51b turned upside down. That is, FIG. 15A illustrates an undersurface of the cap 51b. FIG. 15B is a cross-sectional view seen from an arrow A in FIG. 15A and FIG. 15C is a cross-sectional view seen from an arrow B.

A difference between the cap 51b and the cap 51a is that instead of the second recesses 20, a second groove 24 is provided on the second sealing surface 16b set on the undersurface of the cap 51b. The other parts are the same.

The second groove 24 is provided continuously in a central part of the second sealing surface 16b. The third solder outflow prevention part 26c is provided continuously over the entire perimeter of the second sealing surface 16b closer to the chip mounting region 4 side than the second groove 24, that is, on the side of the space 6 sealed by the mounting part 12, the side wall part 14 and the cap 51b. The fourth solder outflow prevention part 26d is provided continuously over the entire perimeter of the second sealing surface 16b by surrounding the entire second groove 24.

The shape of the second groove 24 is set in such a way that the ball solder 60 does not fall down from the sealing surface as in the case of the shape of the second recesses 20. A width W of the second groove 24 seen from the top surface is slightly greater than twice the radius r of the ball solder 60. The cross section of the second groove 24 is an arcuate or bowl-like smoothly downward convex shape, and a depth H of the second groove 24 is set to be slightly smaller than the radius r of the ball solder 60. More specifically, the depth H of the second groove 24 is preferably 0.7 times or more and 0.9 times or less of r. The other parts are the same as the parts of the cap 51a.

The manufacturing of a semiconductor device according to the sixth embodiment will be described. Steps S11 to S13 are the same as the steps in the fifth embodiment. Next, with the undersurface of the cap 51b turned up, the ball solders 60 are placed into the second groove 24 (step S14). Next, the half-finished product 40 turned upside down is placed on the ball solders 60 placed on the cap 51b with the first sealing surface 16a facing down (step S15). After that, the cap 51b, the ball solders 60 and the package body 91 are heated once and the package body 91 and the cap 51b are bonded and hermetically sealed with solder 61, which is the ball solder 60 melted (step S16), then cooled and solidified again (step S17).

As described above, in the semiconductor device according to the sixth embodiment, since the second groove 24 in which the ball solders 60 can be placed is provided on the second sealing surface 16b of the cap 51b, it is possible to fix the ball solders 60 without the ball solders 60 falling down.

Thus, the ball solders 60 with good solder wettability can be used for bonding the package body 91 and the cap 51b, and the semiconductor device can be hermetically sealed satisfactorily without scrubbing. As a result, it is possible to suppress dropping of solder fragments into the hermetically sealed space 6 and exert an effect of reducing defects in a PIND test.

The third solder outflow prevention part 26c is provided inside the second groove 24 and the fourth solder outflow prevention part 26d is provided outside, which exerts an effect of preventing solder from flowing into or out of the package body 91.

Furthermore, the second groove 24 is adopted instead of the second recesses 20 in the sixth embodiment. There is an effect that processing during formation of the second groove 24 is easier than processing during formation of the second recesses 20 on the second sealing surface 16b, and the ball solders 60 are more easily placed.

The other parts are the same as the parts in the fifth embodiment and description thereof is omitted.

Seventh Embodiment

Figure 16A:
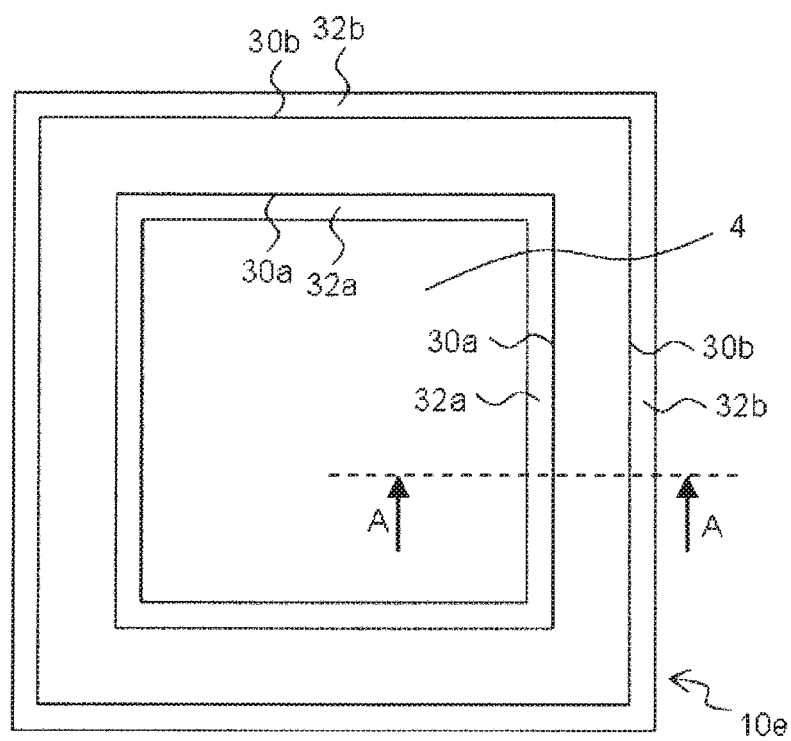
FIGS. 16A and 16B are diagrams illustrating a package body according to the seventh embodiment.
Figure 16B:
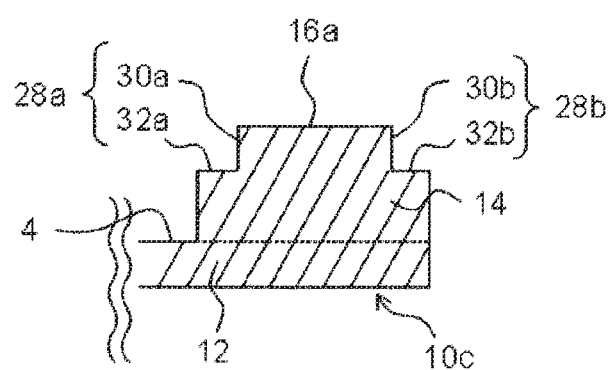

A seventh embodiment will be described. FIGS. 16A and 16B are diagrams illustrating a package body 10e according to the seventh embodiment. FIG. 16A is a top view of the package body 10e. FIG. 16B is a cross-sectional view seen from an arrow A in FIG. 16A.

A configuration of the package body 10e is the same as the configuration of the package body 10c except in that there are no first recesses 18. In other words, the configuration of the package body 10e is the same as the configuration of the package body 91 except in that the first step 28a and the second step 28b are provided on the first sealing surface 16a.

Figure 17A:
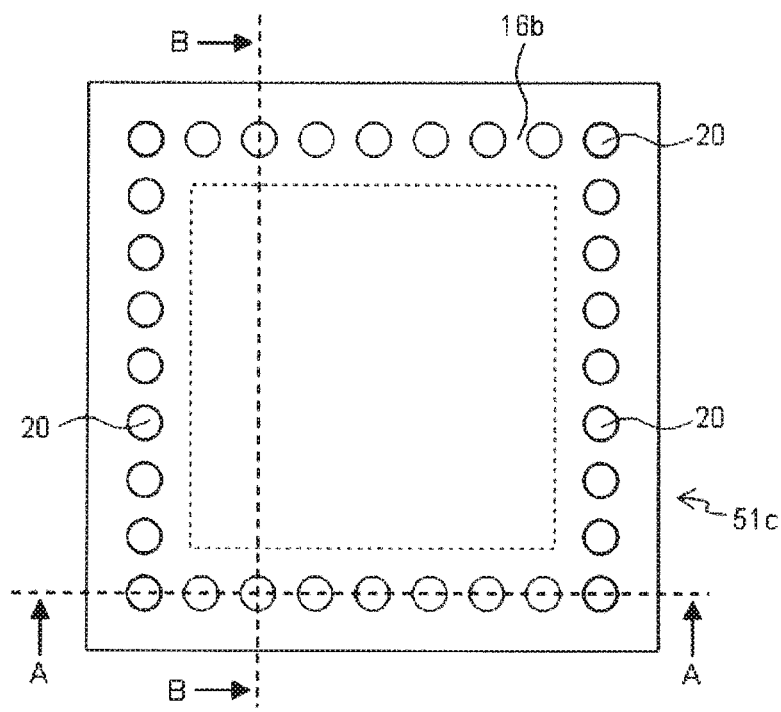
FIGS. 17A, 17B and 17C are diagrams illustrating a cap according to the seventh embodiment.
Figure 17B:
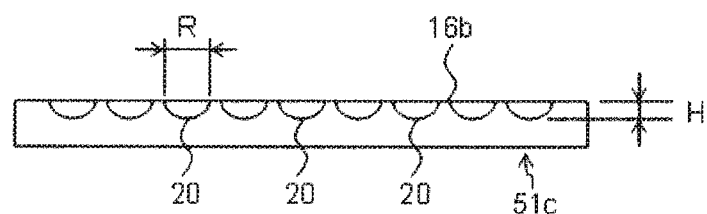
Figure 17C:
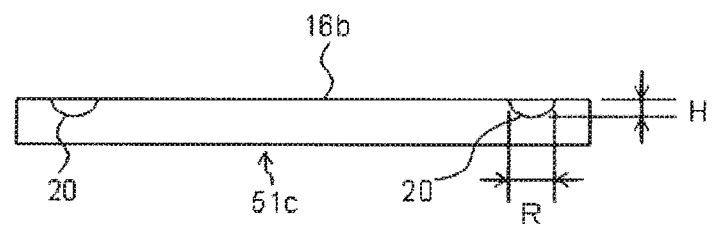

FIGS. 17A, 17B and 17C are diagrams illustrating a cap 51c according to the seventh embodiment. FIG. 17A is a top view of the cap 51c turned upside down. That is, FIG. 17A illustrates an undersurface of the cap 51c. FIG. 17B is a cross-sectional view seen from an arrow A in FIG. 17A and FIG. 17C is a cross-sectional view seen from an arrow B.

A configuration of the cap 51c is the same as the configuration of the cap 51a except in that there is neither the third solder outflow prevention part 26c nor the fourth solder outflow prevention part 26d. In other words, the configuration of the cap 51c is the same as the configuration of the cap 92 except in that the second recesses 20 are provided on the second sealing surface 16b set on the undersurface of the cap 51c.

Figure 18:
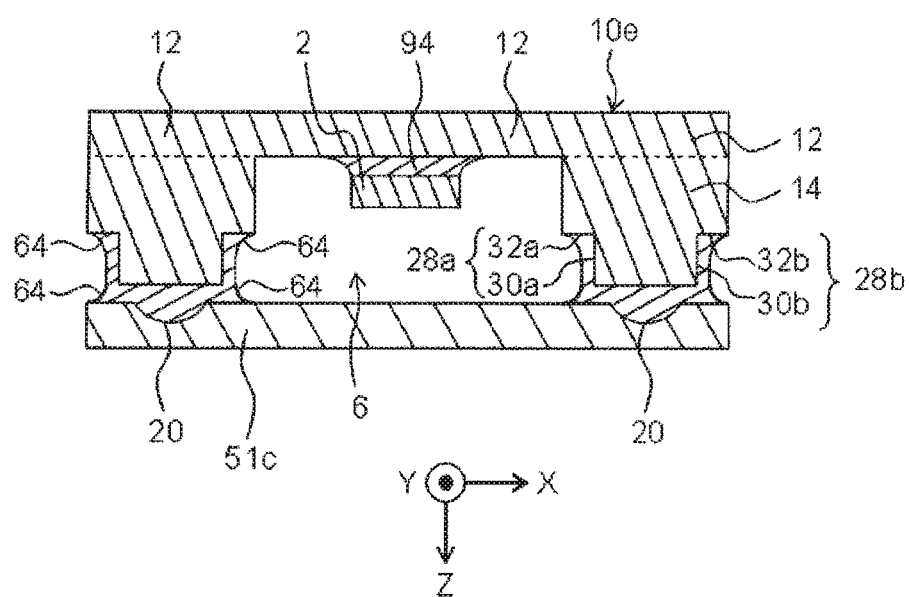
FIG. 18 is a cross-sectional view of the semiconductor device according to the seventh embodiment.

The manufacturing of a semiconductor device according to the seventh embodiment is similar to that in the fifth embodiment. FIG. 18 is a cross-sectional view of the semiconductor device according to the seventh embodiment. FIG. 18 illustrates a state immediately after step S17. According to the third embodiment, the package body 10c is provided with the first recesses 18, the first step 28a and the second step 28b. On the other hand, according to the seventh embodiment, the second recesses 20 are provided on the cap 51c, and the first step 28a and the second step 28b are provided on the package body 10e.

As shown in FIG. 18, in a plan view seen from the Z direction, the first step 28a is positioned on the chip mounting region 4 side with respect to the second recesses 20, that is, on the side of the space 6 sealed by the mounting part 12, the side wall part 14 and the cap 51c. In the plan view seen from the Z direction, the second step 28b is positioned continuously so as to surround the second recesses 20 with respect to the second recesses 20.

That is, a positional relationship between the second recesses 20, and the first step 28a and the second step 28b in the seventh embodiment is the same as the positional relationship between the first recesses 18, and the first step 28a and the second step 28b in the first embodiment.

Unlike the cap 51a according to the fifth embodiment, the cap 51c is provided with neither the third nor the fourth solder outflow prevention part. Thus, the ball solders 60 melted in step S16 may flow out from the second sealing surface 16b.

However, the first step 28a and the second step 28b are provided on the first sealing surface 16a of the package body 10e. The solder that has flowed out forms fillet 64 at a gap between the cap 51c and the package body 10e by surface tension, and so the solder remains around the first step 28a and the second step 28b.

This has an effect of eliminating solder outflow to the side face of the package body 10c and suppressing defects in appearance. Note that heights of the first step 28a and the second step 28b are preferably on the order of 0.5 mm to facilitate formation of the fillet 64. Description of the other parts is omitted.

As described above, since the second recesses 20 in which the ball solders 60 can be placed are provided on the second sealing surface 16b of the cap 51c in the semiconductor device according to the seventh embodiment as well, it is possible to fix the ball solders 60 without the ball solders 60 falling down. That is, it is possible to use the ball solders 60 with good solder wettability for bonding the package body 10e and the cap 51c, and the semiconductor device can be hermetically sealed satisfactorily without scrubbing. As a result, it is possible to suppress dropping of solder fragments into the hermetically sealed space 6, which exerts an effect of reducing defects in a PIND test.

Furthermore, the first step 28a is provided at an inner edge of the first sealing surface 16a of the package body 10e and the second step 28b is provided at an outer edge, which exerts an effect of suppressing defects in appearance caused by solder outflow to the side face of the package body 10e.

Eighth Embodiment

An eighth embodiment will be described. A difference between the eighth embodiment and the seventh embodiment lies in use of a cap 51d instead of the cap 51c.

Figure 19A:
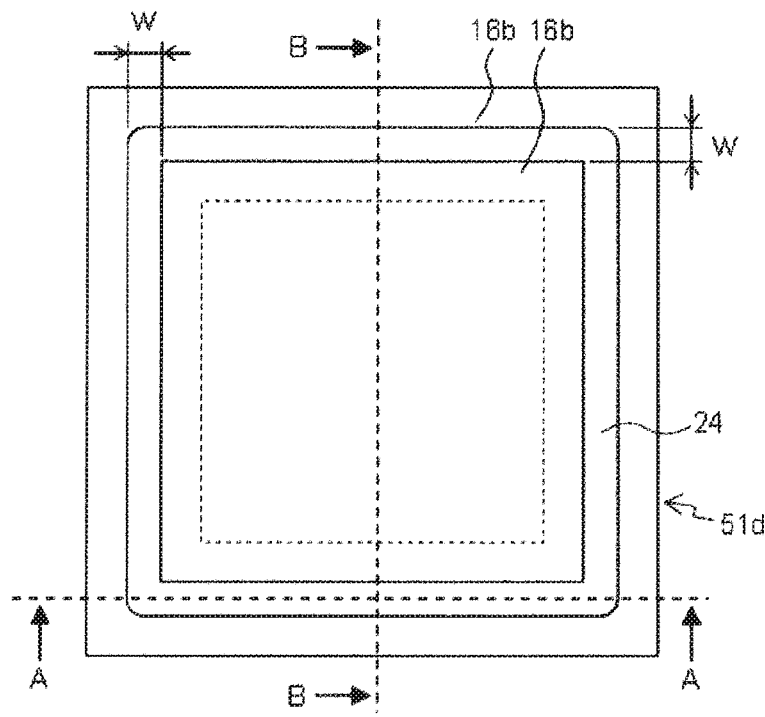
FIGS. 19A, 19B and 19C are diagrams illustrating the cap according to the eighth embodiment.
Figure 19B:
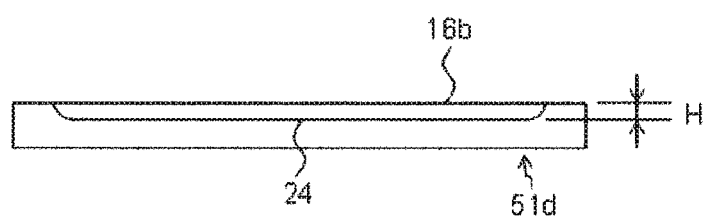
Figure 19C:
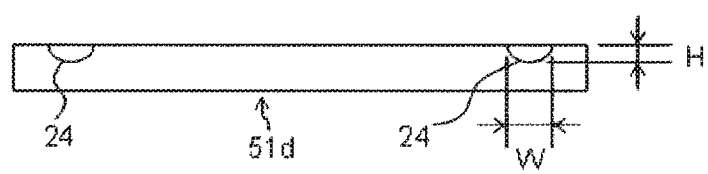
Figure 20:
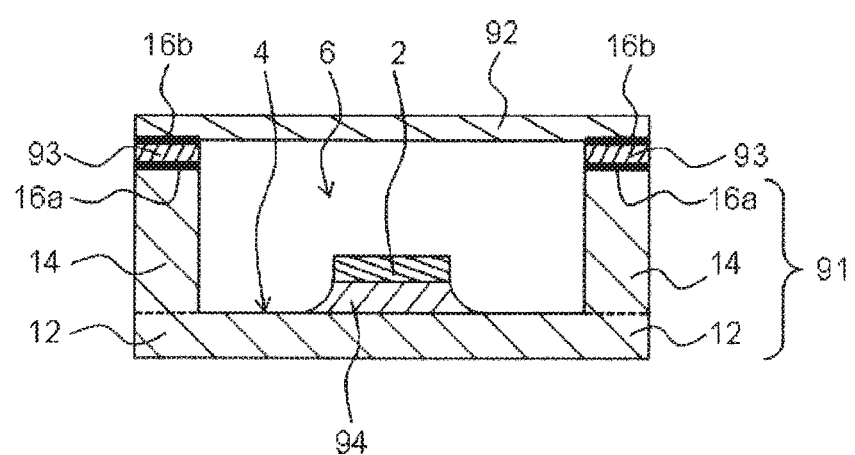
FIG. 20 is a cross-sectional view of a conventional hermetically sealed semiconductor device.
Figure 21A:
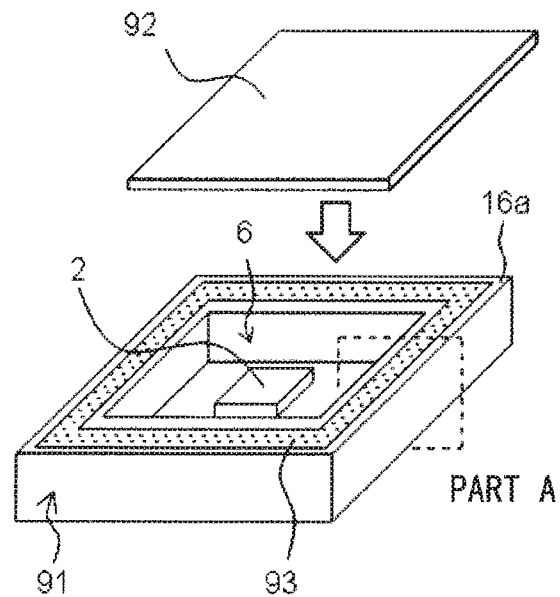
FIGS. 21A and 21B are explanatory diagrams illustrating a sealing method for a conventional semiconductor device.
Figure 21B:
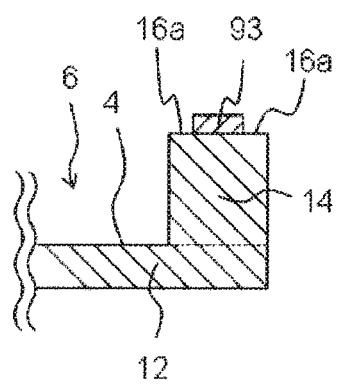
Figure 22A:
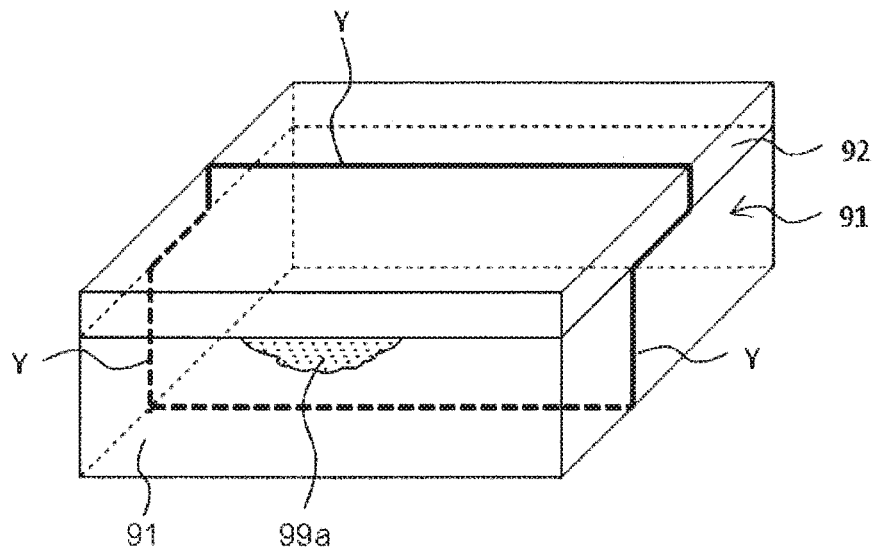
FIGS. 22A and 22B are perspective views illustrating a conventional semiconductor device after sealing.
Figure 22B:
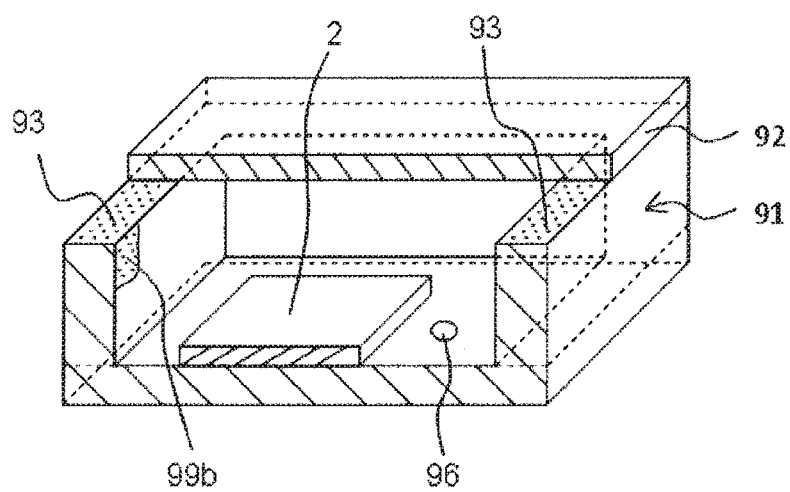

FIGS. 19A, 19B and 19C are diagrams illustrating the cap 51d according to the eighth embodiment. FIG. 19A is a top view of the cap 51d turned upside down. That is, FIG. 19A illustrates an undersurface of the cap 51d. FIG. 19B is a cross-sectional view seen from an arrow A in FIG. 19A and FIG. 19C is a cross-sectional view seen from an arrow B.

A configuration of the cap 51d is the same as the configuration of the cap 51b except in that there is neither the third solder outflow prevention part 26c nor the fourth solder outflow prevention part 26d. In other words, the configuration of the cap 51d is different from the configuration of the cap 92 in that the second groove 24 is provided on the second sealing surface 16b set on the undersurface of the cap 51d.

The manufacturing of a semiconductor device according to the eighth embodiment is similar to the manufacturing according to the sixth embodiment.

The other parts are the same as the parts in the seventh embodiment and description thereof is omitted.

As described above, since the second groove 24 in which the ball solders 60 can be placed is provided on the second sealing surface 16b of the cap 51d in the semiconductor device according to the eighth embodiment as well, it is possible to fix the ball solders 60 without the ball solders 60 falling down. That is, it is possible to use the ball solders 60 with good solder wettability for bonding the package body 10e and the cap 51d, and the semiconductor device can be hermetically sealed satisfactorily without scrubbing. As a result, it is possible to suppress dropping of solder fragments into the hermetically sealed space 6, which exerts an effect of reducing defects in a PIND test.

Furthermore, the first step 28a is provided at an inner edge of the first sealing surface 16a of the package body 10e and the second step 28b is provided at an outer edge, which exerts an effect of eliminating solder outflow to the side face of the package body 10e and thereby suppressing defects in appearance.

The semiconductor device and the method for manufacturing the semiconductor device according to the present disclosure are effective for reducing defects in a PIND test and are particularly suitable for semiconductor products used for aircraft, rockets, artificial satellites and rotary apparatuses or the like.

Note that the present disclosure is not limited to the above-described embodiments, but includes various modifications. For example, the above-described embodiments have been described in detail to describe the present disclosure in an easy-to-understand way, and are not necessarily limited to those provided with all the components described so far.

Furthermore, some components of a certain embodiment may be replaced by other components of another embodiment and components of another embodiment may be added to components of a certain embodiment. Furthermore, it is also possible to add, delete or replace other components to, from or by some components of the respective embodiments.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-045930, filed on Mar. 17, 2020 including specification, claims, drawings and summary, on which the convention priority of the present application is based, is incorporated herein by reference in its entirety.

The invention claimed is:

1. A method for manufacturing a semiconductor device comprising:
   providing a package body including a mounting part having a chip mounting region for mounting a semiconductor chip, a side wall part having a first sealing surface continuously provided over an entire perimeter of the mounting part, surrounding the chip mounting region and provided on the mounting part, a first recess provided on the first sealing surface, and a first solder outflow prevention part continuously provided on the first sealing surface and positioned closer to the chip mounting region side than the first recess;
   providing a cap having a second sealing surface facing the first sealing surface;
   providing a ball solder made of an alloy of gold and tin as principal ingredients;
   placing the ball solder in the first recess;
   placing the cap on the ball solder; and
   melting once and then solidifying the ball solder to bond the first sealing surface and the second sealing surface.

2. The method for manufacturing a semiconductor device according to claim 1, wherein a depth of the first recess is 0.7 times or more and 0.9 times or less of a radius of the ball solder.

3. The method for manufacturing a semiconductor device according to claim 1, wherein the first solder outflow prevention part is a nickel oxide coat.

4. The method for manufacturing a semiconductor device according to claim 1, wherein a second solder outflow prevention part surrounding the first recess is continuously provided on the first sealing surface.

5. The method for manufacturing a semiconductor device according to claim 4, wherein the second solder outflow prevention part is a nickel oxide coat.

6. The method for manufacturing a semiconductor device according to claim 1, wherein the first recess is a first groove provided over an entire perimeter of the first sealing surface.

7. A method for manufacturing a semiconductor device comprising:
   providing a package body including a mounting part having a chip mounting region for mounting a semiconductor chip, a side wall part having a first sealing surface continuously provided over an entire perimeter of the mounting part, surrounding the chip mounting region and provided on the mounting part, a first recess provided on the first sealing surface, and a first step continuously provided on the first sealing surface and having a side face and a bottom surface positioned closer to the chip mounting region side than the first recess;
   providing a cap having a second sealing surface facing the first sealing surface;
   providing a ball solder made of an alloy of gold and tin as principal ingredients;
   placing the ball solder in the first recess;
   placing the cap on the ball solder; and
   melting once and then solidifying the ball solder to bond the first sealing surface and the second sealing surface.

8. The method for manufacturing a semiconductor device according to claim 7, wherein a depth of the first recess is 0.7 times or more and 0.9 times or less of a radius of the ball solder.

9. The method for manufacturing a semiconductor device according to claim 7, wherein a second step surrounding the first recess and having a side face and a bottom surface positioned closer to the mounting part side than the first sealing surface is continuously provided on the first sealing surface.

10. The method for manufacturing a semiconductor device according to claim 7, wherein the first recess is a first groove provided over an entire perimeter of the first sealing surface.

11. A method for manufacturing a semiconductor device comprising:
    providing a package body including a mounting part having a chip mounting region for mounting a semiconductor chip, and a side wall part having a first sealing surface continuously provided over an entire perimeter of the mounting part, surrounding the chip mounting region and provided on the mounting part;
    providing a cap including a second sealing surface facing the first sealing surface, a second recess provided on the second sealing surface, and a third solder outflow prevention part continuously provided on the second sealing surface and positioned closer to the chip mounting region side than the second recess;
    providing a ball solder made of an alloy of gold and tin as principal ingredients;
    placing the ball solder in the second recess;
    placing the package body on the ball solder; and
    melting once and then solidifying the ball solder to bond the first sealing surface and the second sealing surface.

12. The method for manufacturing a semiconductor device according to claim 11, wherein a depth of the second recess is 0.7 times or more and 0.9 times or less of a radius of the ball solder.

13. The method for manufacturing a semiconductor device according to claim 11, wherein the third solder outflow prevention part is a nickel oxide coat.

14. The method for manufacturing a semiconductor device according to claim 11, wherein a fourth solder outflow prevention part surrounding the second recess is continuously provided on the second sealing surface.

15. The method for manufacturing a semiconductor device according to claim 14, wherein the fourth solder outflow prevention part is a nickel oxide coat.

16. The method for manufacturing a semiconductor device according to claim 11, wherein the second recess is a second groove provided over an entire perimeter of the first sealing surface.

17. A method for manufacturing a semiconductor device comprising:

providing a package body including a mounting part having a chip mounting region for mounting a semiconductor chip, and a side wall part having a first sealing surface continuously provided over an entire perimeter of the mounting part, surrounding the chip mounting region and provided on the mounting part;
providing a cap including a second sealing surface facing the first sealing surface, and a second recess provided on the second sealing surface;
providing a ball solder made of an alloy of gold and tin as principal ingredients;
placing the ball solder in the second recess;
placing the package body on the ball solder; and
melting once and then solidifying the ball solder to bond the first sealing surface and the second sealing surface,
wherein a first step is continuously provided on the first sealing surface and has a side face and a bottom surface positioned closer to the chip mounting region side than the second recess in a plan view.

18. The method for manufacturing a semiconductor device according to claim 17, wherein a depth of the second recess is 0.7 times or more and 0.9 times or less of a radius of the ball solder.

19. The method for manufacturing a semiconductor device according to claim 17, wherein a second step is continuously provided on the first sealing surface, has a side face and a bottom surface positioned closer to the mounting part side than the first sealing surface, and surrounds the second recess in a plan view.

20. The method for manufacturing a semiconductor device according to claim 17, wherein the second recess is a second groove provided over an entire perimeter of the first sealing surface.

21. A semiconductor device comprising:
a package body including a mounting part having a chip mounting region for mounting a semiconductor chip, and a side wall part surrounding the chip mounting region and provided on the mounting part; and
a cap,
wherein a first sealing surface continuously provided over an entire perimeter of the side wall part and a second sealing surface provided on the cap and facing the first sealing surface are bonded together by a bonding member,
a space enclosed by the mounting part, the side wall part and the cap is sealed,
a first recess for a ball solder that is the bonding member and made of an alloy of gold and tin as principal ingredients to be placed is provided on the first sealing surface,
a first solder outflow prevention part positioned closer to the space side than the first recess is continuously provided on the first sealing surface, and
a second solder outflow prevention part surrounding the first recess is continuously provided on the first sealing surface.

22. A semiconductor device comprising:
a package body including a mounting part having a chip mounting region for mounting a semiconductor chip, and a side wall part surrounding the chip mounting region and provided on the mounting part; and
a cap,
wherein a first sealing surface continuously provided over an entire perimeter of the side wall part and a second sealing surface provided on the cap and facing the first sealing surface are bonded together by a bonding member,
a space enclosed by the mounting part, the side wall part and the cap is sealed,
a first recess for a ball solder that is the bonding member and made of an alloy of gold and tin as principal ingredients to be placed is provided on the first sealing surface,
a first step is continuously provided on the first sealing surface, has a side face and a bottom surface positioned closer to the mounting part side than the first sealing surface, and is positioned closer to the space side than the first recess, and
a second step is continuously provided on the first sealing surface, has a side face and a bottom surface positioned closer to the mounting part side than the first sealing surface, and surrounds the first recess.

23. A semiconductor device comprising:
a package body including a mounting part having a chip mounting region for mounting a semiconductor chip, and a side wall part surrounding the chip mounting region and provided on the mounting part; and
a cap,
wherein a first sealing surface continuously provided over an entire perimeter of the side wall part and a second sealing surface provided on the cap and facing the first sealing surface are bonded together by a bonding member,
a space enclosed by the mounting part, the side wall part and the cap is sealed,
a second recess for a ball solder that is the bonding member and made of an alloy of gold and tin as principal ingredients to be placed is provided on the second sealing surface,
a third solder outflow prevention part positioned closer to the space side than the second recess is continuously provided on the second sealing surface, and
a fourth solder outflow prevention part surrounding the second recess is continuously provided on the second sealing surface.

24. A semiconductor device comprising:
a package body including a mounting part having a chip mounting region for mounting a semiconductor chip, and a side wall part surrounding the chip mounting region and provided on the mounting part; and
a cap,
wherein a first sealing surface continuously provided over an entire perimeter of the side wall part and a second sealing surface provided on the cap and facing the first sealing surface are bonded together by a bonding member,
a space enclosed by the mounting part, the side wall part and the cap is sealed,
a second recess for a ball solder that is the bonding member and made of an alloy of gold and tin as principal ingredients to be placed is provided on the second sealing surface,
a first step is continuously provided on the first sealing surface, has a side face and a bottom surface positioned closer to the mounting part side than the first sealing surface, and is positioned closer to the space side than the second recess in a plan view, and
a second step is continuously provided on the first sealing surface, has a side face and a bottom surface positioned closer to the mounting part side than the first sealing surface, and surrounds the second recess in a plan view.

* * * * *